(12) United States Patent
Cade et al.

(10) Patent No.: US 9,705,487 B2
(45) Date of Patent: Jul. 11, 2017

(54) USING HARMONIC COMPONENT(S) TO CALCULATE A TEMPERATURE OF A SEMICONDUCTOR DEVICE IN AN INVERTER MODULE

(71) Applicant: Control Techniques Limited, Newtown (GB)

(72) Inventors: Michael Cade, Newtown (GB); Gareth Christopher James, Oswestry (GB)

(73) Assignee: NIDEC CONTROL TECHNIQUES LIMITED, Newtown (GB)

( * ) Notice: Subject to any disclaimer, the term of this patent is extended or adjusted under 35 U.S.C. 154(b) by 601 days.

(21) Appl. No.: 14/193,561

(22) Filed: Feb. 28, 2014

(65) Prior Publication Data

US 2014/0239741 A1    Aug. 28, 2014

(30) Foreign Application Priority Data

Feb. 28, 2013    (GB) .................................. 1303627.2

(51) Int. Cl.
    *H03K 17/14* (2006.01)
(52) U.S. Cl.
    CPC .......... *H03K 17/14* (2013.01); *Y10T 307/773* (2015.04)
(58) Field of Classification Search
    CPC ...................................................... H03K 17/14
    USPC ........................................................ 307/117
    See application file for complete search history.

(56) References Cited

U.S. PATENT DOCUMENTS

| 4,358,739 | A | * | 11/1982 | Nelson | ..................... | H03F 3/343 330/100 |
| 4,872,765 | A | * | 10/1989 | Schodowski | ............ | G01K 7/32 310/318 |
| 5,525,936 | A | * | 6/1996 | Post | ........................ | H03L 1/025 331/116 FE |

(Continued)

FOREIGN PATENT DOCUMENTS

| CN | 1988305 | 6/2007 |
| CN | 101079541 | 11/2007 |
| DE | 102010063148 | 6/2012 |
| WO | 2009/015961 | 2/2009 |
| WO | 2011/152526 | 12/2011 |
| WO | 2012/079936 | 6/2012 |

OTHER PUBLICATIONS

R. Stout, "Linear Superposition Speeds Thermal Modeling—Part 1," Power Electronics Technology, 2007, pp. 20-25.

(Continued)

*Primary Examiner* — Adi Amrany
(74) *Attorney, Agent, or Firm* — Harness, Dickey & Pierce, P.L.C.

(57) ABSTRACT

A method for controlling the temperature of a first semiconductor device on an inverter module of a drive configured to drive an electrical machine is disclosed. The method comprises calculating at least one harmonic component of at least one power loss of at least the first semiconductor device; using the at least one harmonic component of the at least one power loss of the at least the first semiconductor device to calculate a temperature of the first semiconductor device; and if the calculated temperature of the first semiconductor device does not meet a predetermined temperature condition, issuing a command to control the operation of the drive such that the temperature of the first semiconductor device is changed to meet the predetermined temperature condition.

27 Claims, 25 Drawing Sheets

(56) References Cited

U.S. PATENT DOCUMENTS

| | | | | |
|---|---|---|---|---|
| 6,021,054 | A * | 2/2000 | Ueki | H02M 1/15 323/356 |
| 6,639,402 | B2 * | 10/2003 | Grimes | G01N 27/72 324/209 |
| 7,649,724 | B2 | 1/2010 | Huber | |
| 8,151,640 | B1 * | 4/2012 | Kubena | G01C 19/5684 73/503.3 |
| 8,238,131 | B2 | 8/2012 | Hedemaki et al. | |
| 8,522,612 | B1 * | 9/2013 | Kubena | G01C 19/5684 73/503.3 |
| 8,924,173 | B2 * | 12/2014 | Hull Roskos | G01R 23/20 702/65 |
| 9,114,698 | B2 * | 8/2015 | Amano | |
| 2010/0133904 | A1 * | 6/2010 | Klodowski | H02M 7/48 307/24 |
| 2011/0280279 | A1 * | 11/2011 | Gregory | F01D 17/085 374/152 |
| 2013/0049663 | A1 * | 2/2013 | Amano | B60L 3/0007 318/453 |
| 2013/0135906 | A1 | 5/2013 | Kawamura | |
| 2013/0320747 | A1 * | 12/2013 | Ozaki | B60L 3/0061 301/6.5 |
| 2014/0330471 | A1 * | 11/2014 | Ozaki | H02P 29/0088 701/22 |

OTHER PUBLICATIONS

P. Perruchoud and P. Pinewski, "Power Losses for Space Vector Modulation Techniques," Power Electronics in Transportation, IEEE, 1996, pp. 167-173.

R. Valentine, Motor Control Electronics Handbook, $1^{st}$ ed.: McGraw-Hill Professional, Chapter 8, 1998, pp. 242-302.

C. Yun et al., "Thermal Component Model for Electrothermal Analysis of IGBT Module Systems," IEEE Transactions on Advanced Packaging, vol. 24, 2001, pp. 401-406.

"Application Note AN2008-03: Thermal Equivalent Circuit Models," Infineon, 2008.

V. Blasko et al., "On Line Thermal Model and Thermal Management Strategy of a Three Phase Voltage Source Inverter," Industry Applications Conference, $34^{th}$ IAS Annual Meeting, Conference Record of the 1999 IEEE, vol. 2, 1999, pp. 1423-1431.

U. Drofenik et al., "Computationally Efficient Integration of Complex Thermal Multi-Chip Power Module Models into Circuit Simulators," Power Conversion Conference—Nagoya, 2007, pp. 550-557.

* cited by examiner

USING HARMONIC COMPONENT(S) TO CALCULATE A TEMPERATURE OF A SEMICONDUCTOR DEVICE IN AN INVERTER MODULE

CROSS-REFERENCE TO RELATED APPLICATION

This application claims the benefit and priority of Great Britain Patent Application No. 1303627.2 filed Feb. 28, 2013. The entire disclosure of the above application is incorporated herein by reference.

FIELD

This disclosure relates to a thermal model, in particular to a thermal model for a drive inverter module to prevent overheating of semiconductor devices on the module during use.

BACKGROUND

Drives (also known as "drive units") are used to power and control electric motors. Many drives comprise an inverter, which produces an AC output that is sent to the motor. The inverter comprises a plurality of semiconductor devices (e.g. transistors and diodes). When the drive is used to provide a high power output and/or a low output frequency, there is a risk of one or more of the semiconductor devices overheating due to power loss in the devices, thus causing the drive to malfunction. In order to ensure reliable usage of a drive, such overheating is to be avoided.

The simplest way to avoid overheating is to limit the maximum power output of the drive to a conservative level. However, this is likely to overcompensate and result in a drive that is unnecessarily limited in its power output. There is a desire to determine the temperatures of the semiconductor devices more accurately, so that the highest possible power output can be achieved while ensuring the safe and reliable operation of the drive.

Thermal models have been developed that estimate the junction temperature of each of the semiconductor devices, which can then be limited below the maximum value. Many inverters use a single package that contains multiple IGBTs and diodes, totaling N devices. In this type of package, a power loss in one device influences the temperature of that device and also every other device in the package due to its proximity to the other devices resulting in heat transfer to the other devices.

The junction temperature ($T_j$) of each of the semiconductor devices cannot be measured directly, therefore the temperature rise between the junction of one of the devices device and a measured reference temperature ($T_{ref}$) can be estimated using a real-time thermal model in the time domain. To calculate the temperature between the junction of each device and the measured reference temperature, a thermal impedance matrix can be used with the instantaneous power loss in each device, which is proportional to the phase current. A thermal impedance matrix includes the self impedance of each device and the mutual thermal impedances of the other devices with respect to each device in the inverter. For a three phase inverter with six IGBTs and six diodes, the matrix includes 144 elements. The main limitation that prevents this method being freely implemented in a drive is the processor resources required to implement the full thermal impedance matrix. To implement this type of model a considerable number of calculations are to be performed by the processor during each sample period, and since these are carried out in the time domain, the sample rate is to be high enough to prevent aliasing when the inverter is operating at high output frequencies. To achieve this, a significant computational resource is required, which as of yet this is not available in a commercial drive control system.

Attempts have been made to simplify the full thermal impedance matrix, such as by reducing the number of elements in the matrix that are calculated, but these typically result in significant temperature errors, resulting in an underpowered or unreliable drive. Such simplifications have operated in the time domain. It has been appreciated by the inventors that the possible simplifications are limited in the time domain because the peak temperature is proportional to the current in the device. At a non-zero output frequency, the current in one of the output phases is sinusoidal and each device will only conduct for half of the cycle. If the frequency is reduced to zero, when there is no current flow in a device the power loss and the temperature rise due to the self thermal impedance will be zero. Therefore, it is not possible to simplify the model by estimating the temperature of a single device as this will not protect the inverter in this condition.

It has been established by the inventors that, in the frequency domain, the peak steady-state temperature of a device can be determined from the harmonics of the temperature response, which allows the thermal impedance matrix to be reduced to as few as one or two devices. This is a significant advantage when compared to the implementation in the time domain and allows the thermal model to be implemented using the available processor resources of current drives. In a steady-state operating condition, this type of model will not be affected by aliasing and can be implemented using a moderate sample frequency. Furthermore, protection all of the devices in the inverter, can be achieved by calculating only the peak temperature of the hottest IGBT and diode. In the model implemented in the frequency domain, the current magnitude and output frequency are used instead of the three instantaneous phase currents.

In addition, methods have been developed to calculate the peak temperature from the harmonics, select the hottest device for a given set of conditions and combine the self thermal impedances to further simplify the model.

SUMMARY

An invention is set out in each of the independent claims. Optional features are set out in the dependent claims.

According to an aspect, there is provided a method for controlling the temperature of a first semiconductor device on an inverter module of a drive configured to drive an electrical machine, the method comprising:

calculating at least one harmonic component of at least one power loss of at least the first semiconductor device;

using the at least one harmonic component of the at least one power loss of the at least the first semiconductor device to calculate a temperature of the first semiconductor device; and if the calculated temperature of the first semiconductor device does not meet a predetermined temperature condition, issuing a command to control the operation of the drive such that the temperature of the first semiconductor device is changed to meet the predetermined temperature condition.

According to an aspect, there is provided a drive configured to drive an electrical machine and configured to carry out a method according to the above aspect.

In some embodiments, the at least one harmonic component of the at least one power loss of the at least the first semiconductor device is calculated over a complete output cycle of the inverter.

In some embodiments, the at least one harmonic component of the at least one power loss of the at least the first semiconductor device comprises at least two harmonic components of the at least one power loss of the at least the first semiconductor device.

In some embodiments, the at least one power loss of the at least the first semiconductor device comprises a switching power loss of the at least the first semiconductor device.

In some embodiments, the at least one power loss of the at least the first semiconductor device comprises a conduction power loss of the at least the first semiconductor device.

In some embodiments, the at least one power loss of the at least the first semiconductor device comprises at least two power losses of the at least the first semiconductor device.

In some embodiments, the at least the first semiconductor device comprises at least one other semiconductor device on the inverter module.

In some embodiments, the temperature is a junction temperature of the first semiconductor device.

In some embodiments, the temperature is a peak temperature of the first semiconductor device over a complete output cycle of the inverter.

In some embodiments, the calculation of the temperature of the first semiconductor device comprises using at least one thermal impedance.

In some embodiments, the at least one thermal impedance comprises a self thermal impedance of the first semiconductor device.

In some embodiments, the at least one thermal impedance comprises a mutual thermal impedance of the first semiconductor device caused by at least one other semiconductor device on the inverter module.

In some embodiments, the at least one thermal impedance is used with the at least one harmonic component of the at least one power loss of the at least the first semiconductor device to calculate at least one harmonic component of the temperature of the first semiconductor device.

In some embodiments, the calculation of the temperature of the first semiconductor device comprises calculating a peak of the at least one harmonic component of the temperature of the first semiconductor device.

In some embodiments, wherein the first semiconductor device is a transistor.

In some embodiments, wherein the first semiconductor device is a diode.

In some embodiments, the inverter module comprises a temperature-sensitive device for providing a reference temperature for use in the calculation of the temperature of the first semiconductor device.

In some embodiments, the predetermined temperature condition corresponds to a range of temperatures.

In some embodiments, the range of temperatures comprises a predetermined safe operating range of temperatures for the component.

In some embodiments, the predetermined temperature condition is not met when the calculated temperature of the component exceeds a predetermined threshold value, and the condition is met when the calculated temperature of the component is below the threshold value.

In some embodiments, the electrical machine is a motor.

According to an aspect, there is provided a method for controlling the temperature of a subset of a plurality of semiconductor devices on an inverter module of a drive configured to drive an electrical machine, the method comprising:

applying the method of the first aspect above to each semiconductor device of the subset to control the temperature of each semiconductor device of the subset, each semiconductor device of the subset respectively corresponding to the first semiconductor device of first aspect above.

In some embodiments, the subset comprises only two semiconductor devices and the plurality of semiconductor devices comprises additional semiconductor devices.

According to an aspect, there is provided a method for controlling the temperature of a selected semiconductor device of a plurality of semiconductor devices on an inverter module of a drive configured to drive an electrical machine, the method comprising:

assessing present conditions of the inverter module;

based on the assessment, selecting the semiconductor device of the plurality of semiconductor devices that has been predetermined to have the highest expected temperature in conditions corresponding to the present conditions; and applying the method of the first aspect above to control the temperature of the selected semiconductor device, the selected semiconductor device corresponding to the first semiconductor device of the first aspect above.

In some embodiments, after a predetermined period of time, the steps of the preceding aspect are repeated, potentially resulting in the temperature of a different semiconductor device subsequently being controlled instead of the originally selected semiconductor device.

According to an aspect, there is provided a method for calculating the temperature of a first semiconductor device on an inverter module of a drive configured to drive an electrical machine, the method comprising:

calculating at least one harmonic component of at least one power loss of at least the first semiconductor device;

using the at least one harmonic component of the at least one power loss of the at least the first semiconductor device to calculate a temperature of the first semiconductor device.

According to an aspect, there is provided a drive configured to control the temperature of a first semiconductor device on an inverter module of the drive, the drive being configured to drive an electrical machine, the drive being configured to:

calculate at least one harmonic component of at least one power loss of at least the first semiconductor device;

use the at least one harmonic component of the at least one power loss of the at least the first semiconductor device to calculate a temperature of the first semiconductor device; and if the calculated temperature of the first semiconductor device does not meet a predetermined temperature condition, issue a command to control the operation of the drive such that the temperature of the first semiconductor device is changed to meet the predetermined temperature condition.

DRAWINGS

Specific embodiments are now described with reference to the drawings, in which.

DETAILED DESCRIPTION

Figure 1:
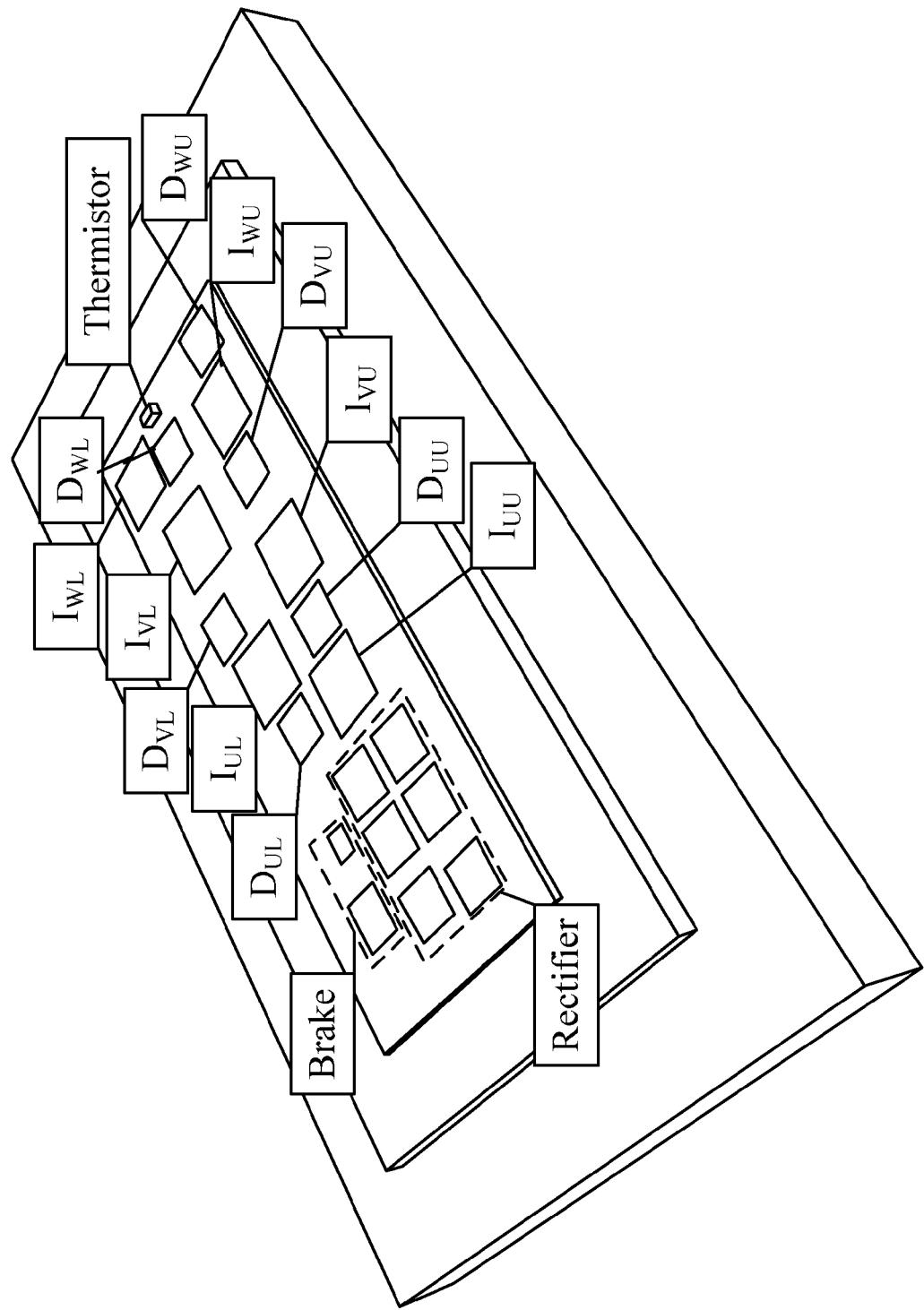
FIG. 1 depicts a layout of a typical power module.

FIG. 1 shows a typical inverter module comprising a plurality of devices. The devices comprise a plurality of diodes and a plurality of IGBTs (insulated gate bipolar transistors). In the inverter module shown, there are six diodes and six IGBTs. A single thermistor is provided at an end of the inverter module, which acts as a feedback device and is used to provide a reference temperature. The temperature of the thermistor is used in estimating the temperature of the devices in the inverter module.

In estimating the temperature of one device, the temperature of the surrounding devices is also relevant, due to the mutual thermal impedance of the surrounding devices. The task at hand is to be able to estimate the temperature of a plurality of devices with only one reference temperature available from the thermistor. In developing a model for a particular inverter module, the positional relationship of the devices is taken into account to ensure that the model accurately estimates the mutual thermal impedances for the devices. The effects due to the position of each device relative to the thermistor are also taken into account, as the thermistor may be located differently in different modules.

In order to make the calculations, a thermal impedance matrix is used, as shown in equation 0.1.

$$[Z_{th,j-ref}] = \begin{bmatrix} Z_{th,11} & \cdots & & & Z_{th,1p} \\ \vdots & \ddots & & & \vdots \\ Z_{th,i1} & & \ddots & & Z_{th,ip} \\ \vdots & & & \ddots & \vdots \\ Z_{th,p1} & \cdots & & & Z_{th,pp} \end{bmatrix} \quad (0.1)$$

The diagonal elements in the matrix represent a temperature rise in each device due to its own power loss. The off-diagonal elements represent a temperature rise in one device due to a power loss in one of the other devices. Present-day drives do not have enough processor power to solve this matrix and use it during the real time operation of the drive. A simplification is desired to ensure that the processor is able to carry out the calculations during operation of the drive.

The inventors have established that the frequency domain can be used to calculate the temperatures. This allows several simplifications to be made.

The output of the drive is controlled so that a three phase AC signal is produced. Each device in the inverter will only conduct for one half of one cycle. If a simplification of the matrix were made in which only the temperature of one device were calculated (in the time domain), the result would be that when a device is conducting the peak current, that device will have the hottest temperature, but there is also a period during which that device has no current, and will effectively have no temperature rise. However, during this period, one of the other components in the module is at its peak temperature, and this would be missed due to the simplification to consider only one device, making this simplification to model only one device unsatisfactory. Operation in the frequency domain helps to overcome this situation.

Unlike the time domain, which is limited to knowing what the actual current is at one point in time, using this frequency domain method enables a prediction to be made as to what the hottest temperature is going to be in the future, rather than only considering the temperature at the present time. The present position in time of the current cycle therefore does not matter, and the hottest temperature can be calculated assuming that the cycle is to continue. If this is done continuously, it is possible to always make sure that the peak device temperature is being calculated.

Figure 2:
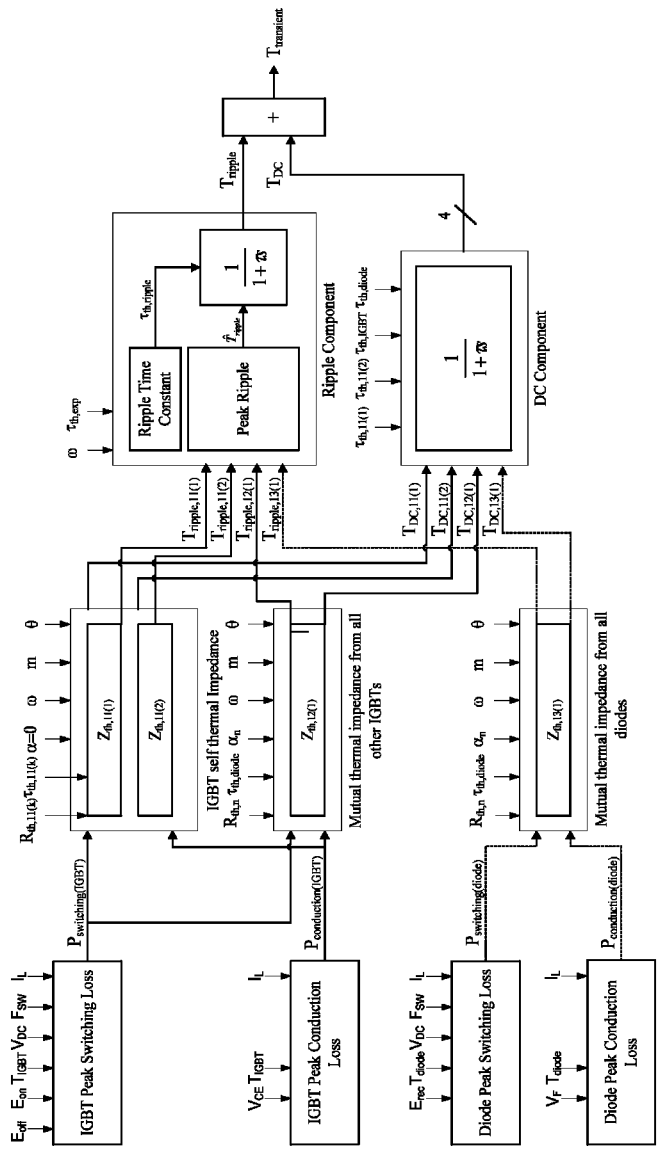
FIG. 2 depicts a control flow diagram for the implementation of the IGBT frequency model for a three phase inverter.

With reference to FIG. 2, the development and implementation of the model is described. The model can be broadly split into three phases: a power loss phase, a thermal impedance phase and a temperature phase. The model shown is for the temperature calculation of one device on the inverter module—an IGBT.

Summary of Power Loss Phase

In the power loss phase, the power loss in a device (which appears like half a sine wave—see FIG. 3) is converted into its frequency components in the frequency domain. The IGBT and diode power loss calculations are each divided into two parts: the switching loss and the conduction loss. The switching loss is the loss due to the switching of the device in order to produce the variable voltage and frequency output. The conduction loss is the loss due to the conduction of the output current between these switching events. These power losses are calculated for the peak conditions.

The IGBT peak switching loss is calculated using the following inputs: $E_{off}$ (the switching energy when the device is turning off), $E_{on}$ (the switching energy when the device is turning on), $T_{IGBT}$ (the temperature of the IGBT—the power loss is proportional to temperature so the estimated temperature is fed back to the power loss calculation), $V_{DC}$ (the DC link voltage), $F_{SW}$ (the switching frequency) and $I_L$ (the phase current).

The IGBT peak conduction loss is calculated using the following inputs: $V_{CE}$ (the on state voltage drop of the IGBT, which is proportional to temperature), $T_{IGBT}$ and $I_L$.

The diode peak switching loss is calculated using the following inputs: $E_{rec}$ (the reverse recovery loss of the diode when the diode is turning off), $T_{diode}$ (the diode temperature), $V_{DC}$, $F_{SW}$ and $I_L$.

The diode peak switching loss is calculated using the following inputs: $V_F$ (the on state voltage drop of the diode, which is proportional to temperature), $T_{diode}$ and $I_L$.

Tests are carried out in different conditions during the development of the drive to create these power loss models, which then operate during actual use of the drive. $E_{off}$, $E_{on}$, $V_{CE}$, $E_{rec}$ and $V_F$ are all device parameters that are measured and stored during the development of the drive, before the drive is fully operated. They are all measurements relating to power loss. The remaining inputs in the power loss phase are internal feedback parameters that are measured during the operation of the drive.

The output of the power loss phase is therefore four peak power losses.

Summary of Thermal Impedance Phase

In the thermal impedance phase, the peak power losses are multiplied by the harmonic components of the temperature rise developed for a unity peak power loss. The outputs of this phase are the harmonic components of the temperature rise for the peak power.

In this model, instead of calculating the temperature rise for all 144 thermal impedance elements of the full thermal matrix (where each element consists of one or more thermal networks), only three thermal impedances are used, with a total of four thermal networks. The reduction in the number of thermal impedances greatly reduces the processing power required to perform the calculations. The thermal impedances, $Z_{th}$, that are used in this model are the self thermal impedance of the IGBT for which the temperature is being calculated, which is modelled using two thermal networks, the mutual thermal impedance from all other IGBTs and the mutual thermal impedance from all diodes. These thermal impedances are chosen prior to the operation of the drive as being the thermal impedances that are used to calculate the temperature of the anticipated hottest device under predetermined conditions. The self thermal impedance is dived into two parts, which allows the thermal impedance to be modelled using two time constants. This is done because the self thermal impedance includes the influence of the device, which has a very short time constant, and the case/heatsink which has a much longer time constant.

The temperature rise due to the IGBT self thermal impedance is calculated using the following inputs: the peak switching and conduction power losses of the IGBT, $R_{th,\ 11(k)}$ (the thermal resistance of the network number k), $\tau_{th,\ 11(k)}$ (the time constant of the network number k), $\alpha=0$ (the offset angle—the phase shift used to represent the relationship of the peak power loss in each device in the inverter with reference to the modelled device, hence being =0 for this IGBT), $\omega$ (frequency), m (the modulation) and $\theta$ (the power factor).

The mutual thermal impedance from all other IGBTs is calculated using the following inputs: the peak switching and conduction power losses of the IGBT in the frequency domain, $R_{th,\ n}$ (the thermal resistance of the other IGBTs), $\tau_{th,\ IGBT}$, $\alpha_n$, $\omega$, m and $\theta$.

The mutual thermal impedance from all diodes is calculated using the following inputs: the peak switching and conduction power losses of the diode in the frequency domain, $R_{th,\ n}$ (the thermal resistance of the diodes for the harmonic n), $\tau_{th,\ diode}$, $\alpha_n$, $\omega$, m and $\theta$.

The $R_{th}$, $\tau_{th}$, and $\alpha$ inputs are thermal parameters calculated and stored before the drive is put into operation. They are all related to thermal impedance. The $\omega$, m and $\theta$ inputs are internal feedback parameters that are measured during the operation of the drive.

The output of the thermal impedance phase is two sets of four harmonic components in the frequency domain. Each of the four thermal impedances outputs a $T_{DC,\ \ldots}$ and a $T_{Ripple,\ \ldots}$. The DC component is the temperature the device would reach when the time constant of the thermal network was sufficient to filter the change of power loss at the output frequency of the inverter. The ripple temperature is the change of temperature with reference to the DC temperature and reduces as the output frequency is increased.

$T_{Ripple}$ is calculated using only the first and second harmonic terms for the switching power loss, and only the first, second and third harmonic terms for the conduction power loss. This reduces the amount of processor power required, which would increase if higher harmonics were also included. The fundamental and second harmonic terms have been found to give sufficiently accurate results.

Summary of Temperature Phase

The temperature phase involves a DC component and a ripple component. The ripple component is used to find the peak temperature. This is achieved by adding the harmonics together and then estimating the peak temperature over the next cycle. The outputs of the DC component and the ripple component are absolute temperature values and $T_{DC}$ and $T_{Ripple}$, respectively. The use of the frequency domain therefore ends during this phase, as an input of a plurality of harmonic components in the frequency domain input has been converted to an absolute temperature rise. $T_{Ripple}$ and $T_{DC}$ are then added together to produce the final output of the model, $T_{transient}$ (the absolute transient temperature rise). The transient temperature is the change of the steady state temperature and is added to the reference temperature to give the absolute temperature.

The ripple component has as its inputs: the four $T_{Ripple, ...}$ outputted from the thermal impedance phase, $\omega$ and $\tau_{th, exp}$ (the time constant applied to the peak ripple to give a transient temperature response).

The DC component has as its inputs: the four $T_{DC, ...}$ outputted from the thermal impedance phase, $\tau_{th, 11(1)}$ (the time constant of network 1 in the self thermal impedance), $T_{th, 11(2)}$ (the time constant of network 2 in the self thermal impedance), $\tau_{th, IGBT}$ (time constant of the IGBT network) and $\tau_{th, diode}$.

The $\tau_{th}$ inputs are thermal parameters calculated and stored before the drive is put into operation.

Embodiments are described in more detail below.

1. Development of a Thermal Model
1.1 Introduction

The model is now described in more detail. In this model, the magnitude of the output current is used to calculate the temperature between the junction of one of the devices and the measured reference temperature over a complete output cycle of the inverter ($1/F_{out}$). This temperature is represented by a series of frequency components, including the DC component (0 Hz), the fundamental of the output frequency and a number of harmonics terms. These frequency components are used to calculate the peak steady-state temperature of the hottest IGBT and diode at every sample. Therefore, the output of the steady-state model is the peak temperature that would occur if the input parameters were held constant over a period of time. The steps used to develop the steady-state model are summarized below:

1. Determine the power loss of a device over a complete output cycle due to its switching characteristics and represent this loss as a series of frequency components. For the switching loss, these components are dependent on the current magnitude, switching frequency and DC link voltage.

2. Apply the frequency components for the switching loss to an equivalent Foster network and calculate the resulting temperature rise in the frequency domain.

3. Determine the power loss of a device over a complete output cycle due to its conduction characteristics and represent this loss as a series of frequency components. For the conduction loss, these components are dependent on the current magnitude, modulation index and the angle between the fundamental output voltage and current (displacement angle).

4. Apply the frequency components of the conduction loss to an equivalent Foster network and calculate the resulting temperature rise in the frequency domain.

5. Combine the frequency components for the switching and conduction loss.

6. Use the magnitude and phase of the frequency components to calculate the peak steady-state temperature between the junction of the device and the measured reference temperature.

Throughout the development of the steady-state thermal model, the frequency components used to represent the power loss and the duty cycle are selected to minimize the number of calculations required to estimate the device temperature. During the development of the model care is taken to ensure that the temperature calculated when using the self thermal impedance of a device is never underestimated. However, in many operating conditions it is the thermal model for the inverter that restricts the maximum performance of a drive. Thus, care is also to be taken to prevent excessive overestimation of the device temperature since this can lead to a reduction in the maximum output current available from the inverter and ultimately an uncompetitive product.

1.2 Steady-State Thermal Model Development

The frequency components used to calculate the steady-state temperature response over a complete output cycle of the inverter are developed in this section. The thermal model developed in this section is based on the calculation of the peak steady-state temperature over a complete output cycle of the inverter and this calculation is carried out in the frequency domain. Therefore, the first step is to calculate the frequency components for the power loss due to the switching and conduction losses in an IGBT and diode. These losses are related to the current flowing in a device and in the next section this current is approximated by a number of frequency components. These frequency components are then used to develop the switching and conduction loss models.

1.2.1 Frequency Components of the Current in an IGBT and Anti-Parallel Diode

Figure 3:
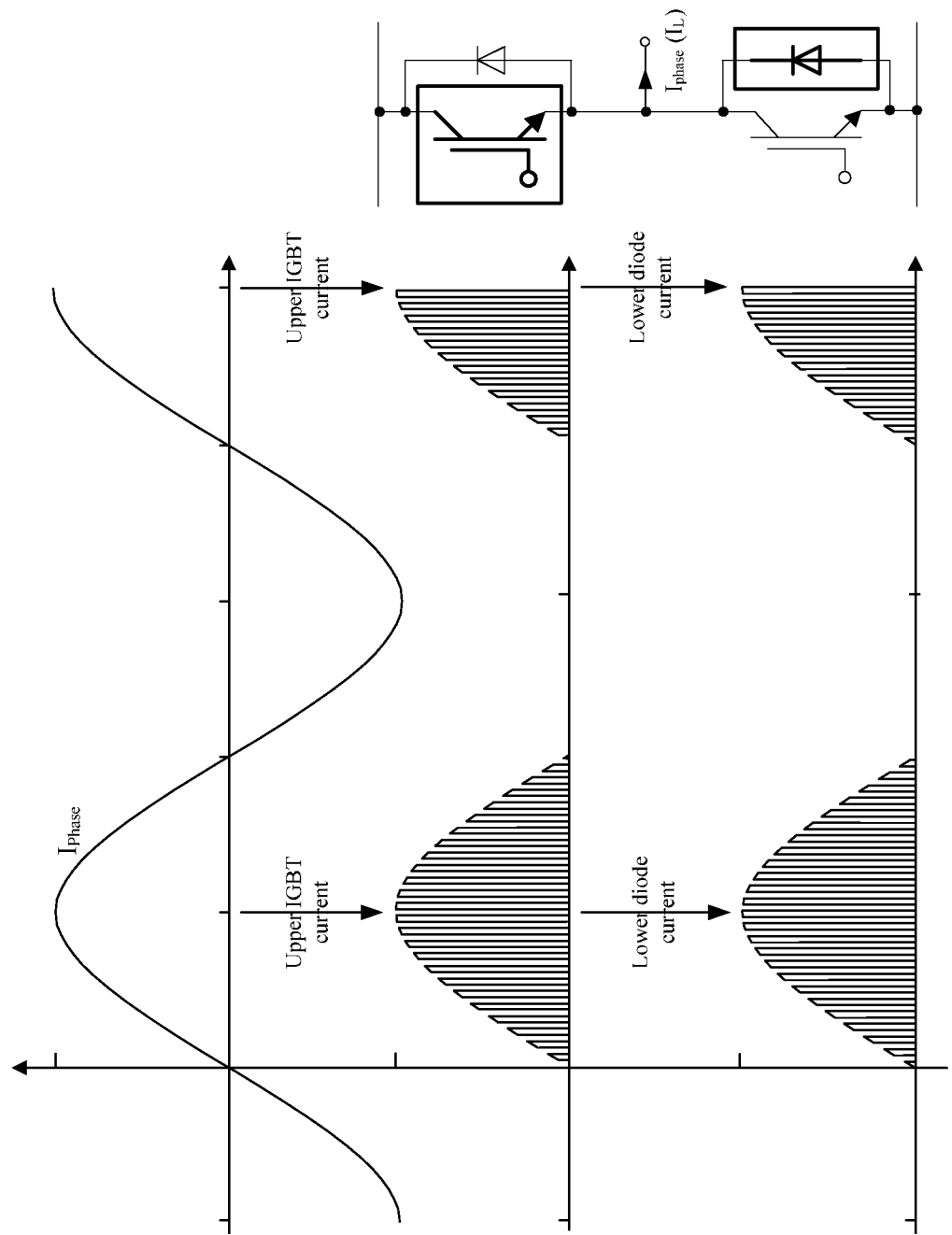
FIG. 3 depicts a phase current in an IGBT and an anti-parallel diode.

In an inverter, the IGBTs are switched to control the magnitude of the voltage applied to a motor and as a result, the current in a device is discontinuous. However, the sum of the current in an IGBT and its anti-parallel diode is equal to the positive (upper IGBT and lower diode) or the negative (lower IGBT and upper diode) phase current ($I_L$). Thus, in order to represent the current in the frequency domain, it is assumed that the phase current flowing in an IGBT and its anti-parallel diode is a half-wave rectified sinusoid. This concept is illustrated in FIG. 3.

The frequency components for the phase current in these devices can be expressed by the Fourier series:

$$I_L(\omega t) = a_0 + \sum_{n=1}^{\infty} a_n \cos(n\omega t) + b_n \sin(n\omega t) \quad (1.1)$$

and for a half-wave rectified sinusoid, the Fourier coefficients are as follows:

$$a_0 = \frac{\hat{I}_L}{\pi} \quad (1.2)$$

$$a_n = \begin{cases} \frac{-2\hat{I}_L}{\pi(n^2-1)} \to n = \{2, 4, \dots\} \\ 0 \to n = \text{odd} \end{cases} \quad (1.3)$$

$$b_n = \begin{cases} \frac{\hat{I}_L}{2} \to n = 1 \\ 0 \to n \geq 2 \end{cases} \quad (1.4)$$

As the number of harmonics (n) in the Fourier series is increased, the response of the Fourier series will become a more accurate representation of the original current waveform in the time domain, although more calculations will need to be performed by the microprocessor Therefore, to develop a thermal model that can be implemented using the available resources the load current is approximated using only three Fourier coefficients. These are $a_0$, $a_2$ and $b_1$. Thus, in this model the phase current flowing in an IGBT and its anti-parallel diode is approximated by:

$$I_L(\omega t) = \hat{I}_L\left(\frac{1}{\pi} + \frac{1}{2}\sin(\omega t) - \frac{2}{3\pi}\cos(2\omega t)\right) \quad (1.5)$$

The impact of this approximation is investigated later in this section. To model the current in an upper and lower device in the same phase or the devices in other phases of the inverter an offset angle ($\alpha$) is used. In addition, to develop the model for the conduction loss, the displacement angle ($\theta$) is also included. This angle defines the relationship between the applied voltage, which is directly related to the duty cycle of a device, and the resultant output current. Including these angles, the phase current is represented by:

$$I_L(\omega t) = \hat{I}_L\left(\frac{1}{\pi} + \frac{1}{2}\sin(\omega t + \theta + \alpha) - \frac{2}{3\pi}\cos(2\omega t + 2\theta + 2\alpha)\right) \quad (1.6)$$

By definition, for the device being modelled ($\alpha$=0), the peak phase voltage occurs when $\omega t=\pi/2$. The current in this device ($I_L$) is referenced to this point by the displacement angle, i.e. the current is in phase with the voltage when the displacement power factor $\cos(\theta)$ is unity (i.e. $\theta$=0). The output voltage and the corresponding current in the other devices is then referenced to the modelled device by the offset angle ($\alpha$), i.e. there is 120° between the peak voltage in each phase and 180° between the upper and lower devices.

1.2.2 Switching Loss Model

Figure 4:
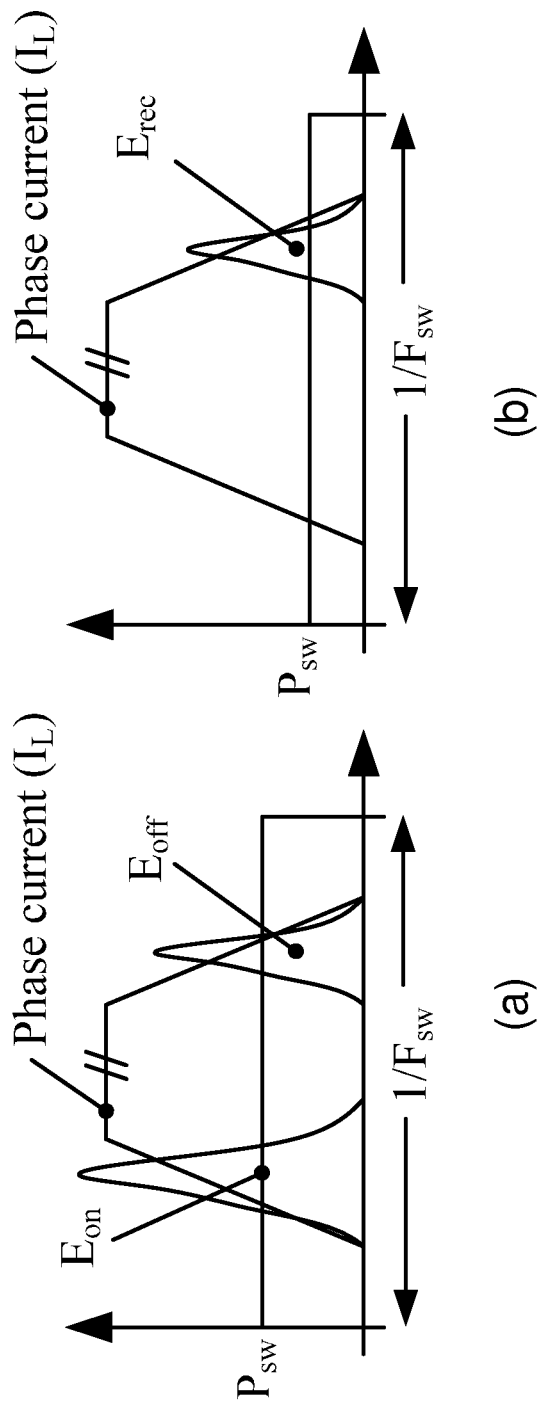
FIG. 4 depicts a switching power loss over a switching frequency cycle (a) IGBT (b) diode.

The frequency components are divided into those representing the temperature rise due to the switching loss, which is covered in this section, and the conduction loss, covered in the next section. To develop a frequency model for the switching loss, the power loss due to the switching energy is defined as the average power loss ($P_{sw}$) over a switching period ($1/F_{sw}$). For an IGBT, this loss is dependent on the switching energy when the device is turning on ($E_{on}$) and off ($E_{off}$). For a diode, the only significant switching energy is due to the reverse recovery ($E_{rec}$) when the diode is turning off. The definition of the switching loss for an IGBT and diode is illustrated in FIG. 4.

In this approximation, it is assumed that every device switches on and off during each switching period and there is no significant temperature ripple due to the peak loss that occurs when the devices are actually switching, i.e. the effect of the instantaneous power loss is filtered by the thermal time constants. Using this approach, the peak switching loss is defined as the power loss calculated when the device switches the peak phase current. For an IGBT the peak switching loss (averaged over the switching period) is given by:

$$\hat{P}_{sw} = F_{sw}E_{on}(I_L, T_j, V_{dc}) + F_{sw}E_{off}(I_L, T_j, V_{dc}) \quad (1.7)$$

For a diode:

$$\hat{P}_{sw} = F_{sw}E_{rec}(I_L, T_j, V_{DC}) \quad (1.8)$$

To represent the switching loss over the entire output cycle of the inverter ($\omega t$=0 to $2\pi$) it is assumed that the switching loss is proportional to the phase current. This allows the switching loss to be approximated using the same frequency components:

$$P_{sw}(\omega t) = \hat{P}_{sw}\left(\frac{1}{\pi} + \frac{1}{2}\sin(\omega t + \theta + \alpha) - \frac{2}{3\pi}\cos(2\omega t + 2\theta + 2\alpha)\right) \quad (1.9)$$

Figure 5:
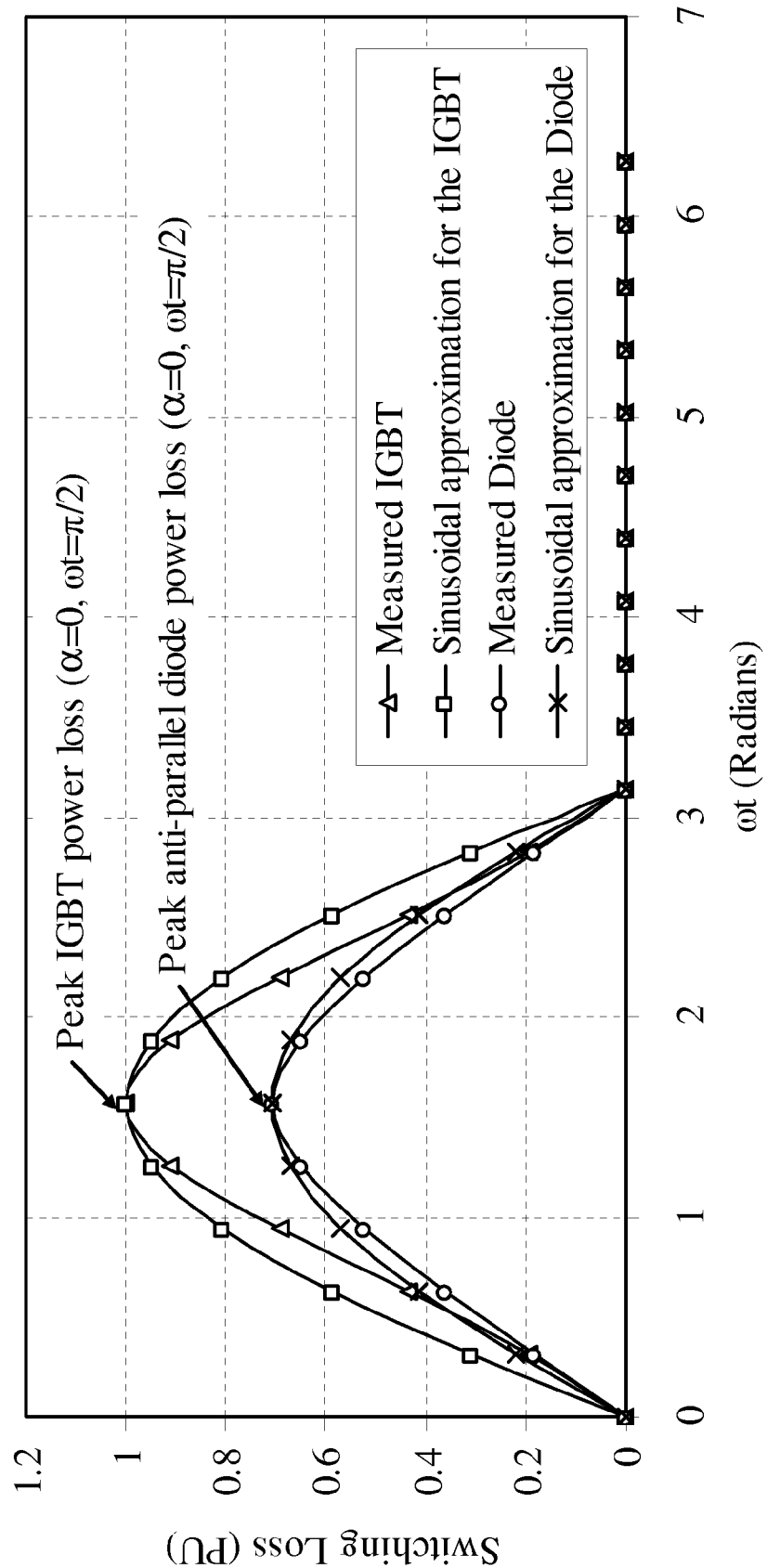
FIG. 5 depicts a comparison of the measured and approximated switching loss for an IGBT and diode over a complete output cycle of an inverter.
Figure 6:
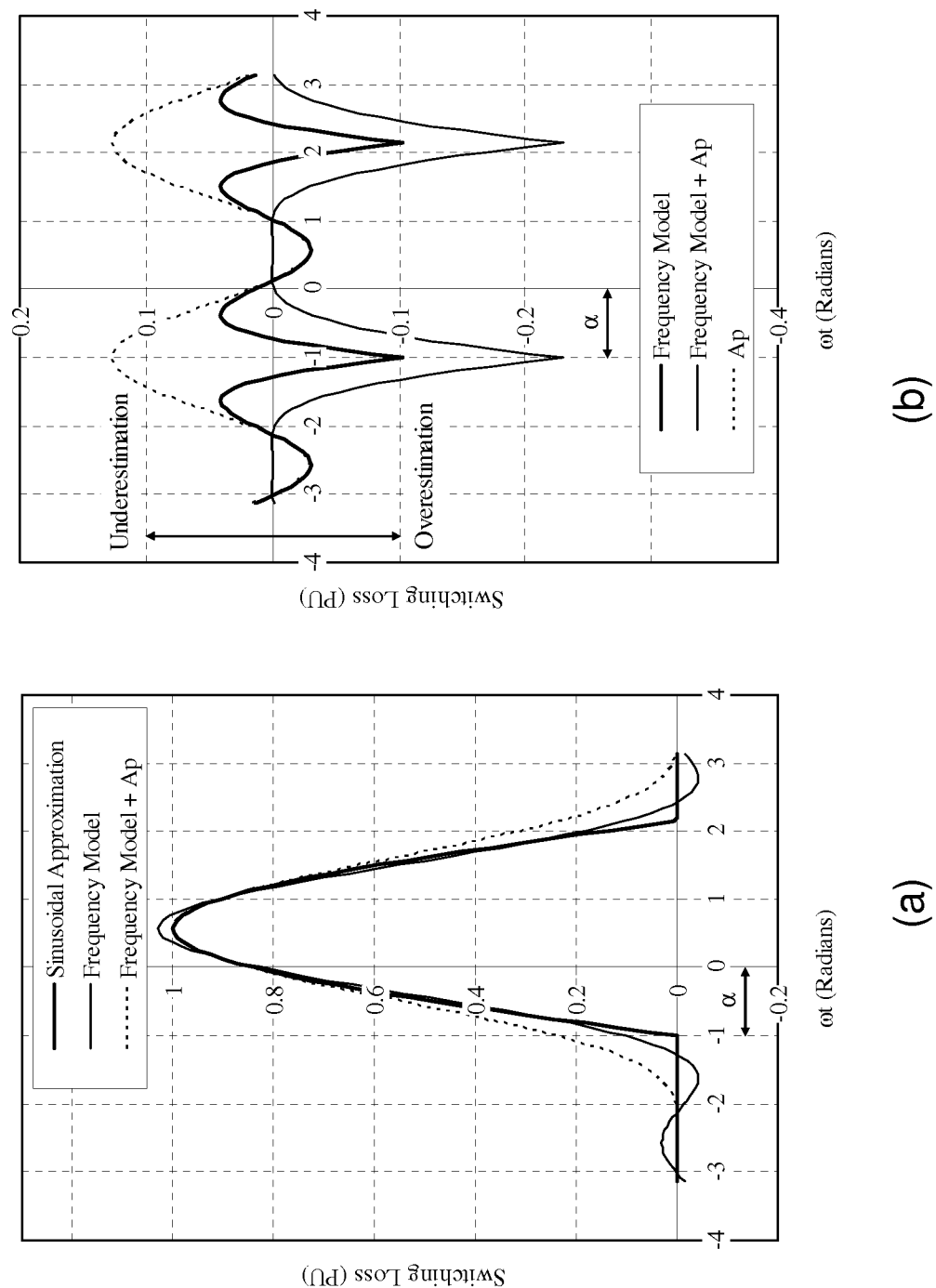
FIG. 6 depicts a device switching loss calculated over a complete output cycle of the inverter (a) response of the sinusoidal and frequency model (b) the difference between the frequency and sinusoidal response ($\alpha$=1 radian)

However, the switching energy in a device is not directly proportional to the phase current and the actual switching loss will not be sinusoidal. This effect is shown in FIG. 5. In this figure, the switching loss calculated using the measured characteristics from an actual device is compared with the sinusoidal approximation (with the same peak value) over a complete output cycle. Apart from the peak switching loss, the power loss estimated by the sinusoidal approximation for the IGBT and diode is higher than the measured loss and as a result, the device temperature will be overestimated. However, the power loss is approximated by only three Fourier coefficients (Equation 1.9) and this simplification will introduce an additional error. To show the effect of this approximation, the power loss calculated using the frequency model is compared with the sinusoidal approximation, i.e. the response of the frequency model if all of the harmonic terms (n=1 to ∞) were used. The comparison is shown in FIG. 6(a) and the difference between the responses (sinusoidal approximation—frequency model) can be seen in the FIG. 6(b).

From the comparison it is evident that power loss calculated by the frequency model can be negative. This is highlighted in FIG. 6(b). In this figure a positive value indicates that the magnitude of the frequency model is smaller than the sinusoidal approximation, i.e. the instantaneous power loss is underestimated. Since the output of the thermal model is the peak steady-state temperature the negative power loss will have little effect on the temperature of a single device. However, when combining the frequency components from neighbouring devices the negative power loss could be aligned with the peak loss in another device and in this instance the negative power loss will reduce the estimated temperature. Furthermore, the peak loss in the frequency model is 3% higher than the sinusoidal approximation and this will have a direct impact on the temperature estimated at low output frequencies.

To improve the approximation of the power loss, the magnitude of the Fourier coefficients in Equation 1.9 ($a_0$ and $a_2$) are modified in order to remove the negative power loss and the peak error. The additional component ($A_p$) added to the initial frequency model is:

$$A_p(\omega t) = \hat{P}_{sw}[A_{p(DC)} + A_{p(ac)}\cos(2\omega t + 2\theta + 2\alpha)] \quad (1.10)$$

The constants used in this equation were determined from the inspection of the error characteristics and the magnitudes of these are:

$A_{p(DC)}$=0.048
$A_{p(ac)}$=0.077

The response of Equation 1.10 is shown in FIG. 6(b). By combining Equations 1.9 and 1.10, the switching loss in a device is approximated by:

$$P_{sw}(\omega t) = \hat{P}_{sw}\left(\begin{array}{l}\left(\frac{1}{\pi} + A_{p(DC)}\right) + \frac{1}{2}\sin(\omega t + \theta + \alpha) \\ -\left(\frac{2}{3\pi} - A_{p(ac)}\right)\cos(2\omega t + 2\theta + 2\alpha)\end{array}\right) \quad (1.11)$$

As shown in FIG. 6(a), when compared to the initial sinusoidal approximation, the switching loss estimated by Equation 1.11 (Frequency model+$A_p$) is never underestimated and the peak value in both responses is identical. In the following section, this equation is used to calculate the temperature response for a device due to its switching characteristics.

1.2.2.1 Temperature Response

The simplest method of representing the thermal characteristics of a device in a power module is to use the measured or calculated thermal impedance in the form of an equivalent Foster network. The characteristics of this network can be easily implemented in a microprocessor and by using linear superposition (R. Stout, "Linear Superposition Speeds Thermal Modeling—Part 1", *Power Electronics Technology*, 2007, pp. 20-25, incorporated herein by reference) the thermal coupling from any neighbouring devices can be included. The response of a Foster network element (first order filter) in the Laplace domain is given by:

$$Z_{th}(s) = \frac{R_{th}}{(1+\tau s)} \quad (1.12)$$

To calculate the temperature response due to the switching loss ($T_{sw}$) the following equation is to be solved:

$$T_{sw}(s) = P_{sw}(s) Z_{th}(s) \quad (1.13)$$

In the steady-state, the device temperature is given by:

$$T_{sw}(t) = T_{DC} T_{ripple}(t) \quad (1.14)$$

With a constant power loss, the temperature rise due to the DC component ($T_{DC}$) will be constant. However, the ripple temperature ($T_{ripple}$) is the sum of the frequency components and the magnitudes of these components are dependent on the output frequency of the inverter. For example, if the general sinusoid term:

$$A_n \sin(n\omega t) \quad (1.15)$$

is applied to a first order filter the magnitude of the output response is reduced by the filter magnitude $A_{Fn}$ and is phase shifted by the angle $\beta_n$. Therefore, the output of the filter is given by:

$$A_n A_{Fn} \sin(n\omega t + \beta_n) \quad (1.16)$$

where $$A_{Fn} = \frac{1}{\sqrt{1+(n\omega\tau)^2}} \quad (1.17)$$

and $$\beta_n = -\tan^{-1}(n\omega\tau) \quad (1.18)$$

The fundamental and harmonic terms for the ripple temperature due to the switching loss in a device (solution of Equation 1.13), including the effect of the filter element on the magnitude and phase shift of these components, are shown in Table 1.1.

Where possible any overestimation of the temperature should be avoided since this will have a direct impact on the maximum output current that can be achieved. As the output frequency is increased the contribution from the harmonics is reduced and the term $A_p$ is no longer required. Therefore, the constant $A_{p(DC)}$, which was added to ensure that the peak temperature is correct at a low output frequency, is multiplied by the magnitude of a first order filter (Equation 1.17) calculated for a first harmonic term (n=1). Thus, as the output frequency is increased the magnitude of the DC component tends towards the calculated Fourier coefficient $a_0$ (i.e. $1/\pi$). This prevents the temperature from being overestimated at higher output frequencies. As shown in Table 1.1, the constant $A_{p(ac)}$ is reduced by the filter associated with the second harmonic ($A_{F2}$).

TABLE 1.1

Frequency components of the temperature rise due to the device switching loss

| Frequency Component | | Magnitude |
|---|---|---|
| DC | $A_{DC}$ | $\hat{P}_{sw} R_{th} \left( \frac{1}{\pi} + A_{p(DC)} A_{F1} \right)$ |
| $\sin(\omega t)$ | $A_{s1}$ | $\frac{\hat{P}_{sw} R_{th} A_{F1}}{2} \cos(\theta + \alpha + \beta)$ |
| $\sin(2\omega t)$ | $A_{s2}$ | $\hat{P}_{sw} R_{th} A_{F2} \left( \frac{2}{3\pi} - A_{p(ac)} \right) \sin(2\theta + 2\alpha + \beta)$ |
| $\cos(\omega t)$ | $A_{c1}$ | $\frac{\hat{P}_{sw} R_{th} A_{F1}}{2} \sin(\theta + \alpha + \beta)$ |
| $\cos(2\omega t)$ | $A_{c2}$ | $-\hat{P}_{sw} R_{th} A_{F2} \left( \frac{2}{3\pi} - A_{p(ac)} \right) \cos(2\theta + 2\alpha + \beta)$ |

Once calculated, the sin and cos components for the fundamental and second harmonic can be combined into a single term and the ripple temperature can be calculated using:

$$T_{ripple(sw)} = A_{sw1} \cos(\omega t + \sigma_1) + A_{sw2} \cos(2\omega t + 2\sigma_2) \quad (1.19)$$

where $A_{sw1}$ and $A_{sw2}$ are the combined magnitude of the sin and cos components in the fundamental and second harmonic terms and $\sigma_n$ is the resulting phase shift. This process can be used to combine the frequency response for any number of devices (self and mutual) or network elements. Therefore, the ripple component of the temperature response due to the switching loss in multiple devices can be represented by just two frequency components; this is described in more detail section 2 below.

1.2.2.2 Comparison of the Temperature Response

Figure 7:
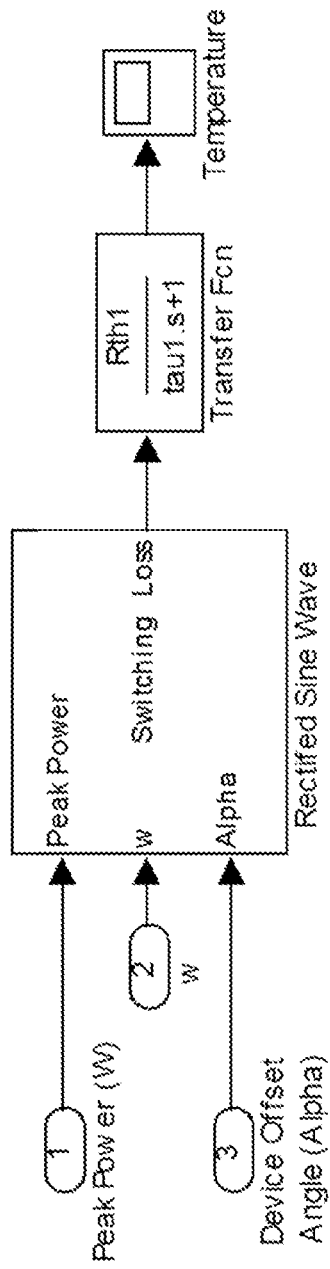
FIG. 7 depicts a simulink sinusoidal switching loss model.

To compare the temperature response, the frequency components for the switching loss model (Table 1.1) are implemented in Matlab (or other suitable software). This is compared with the temperature calculated using the sinusoidal approximation. The response of this model is calculated using Simulink (or other suitable software) and the basic model for a single device and Foster network element is shown in FIG. 7.

Figure 8:
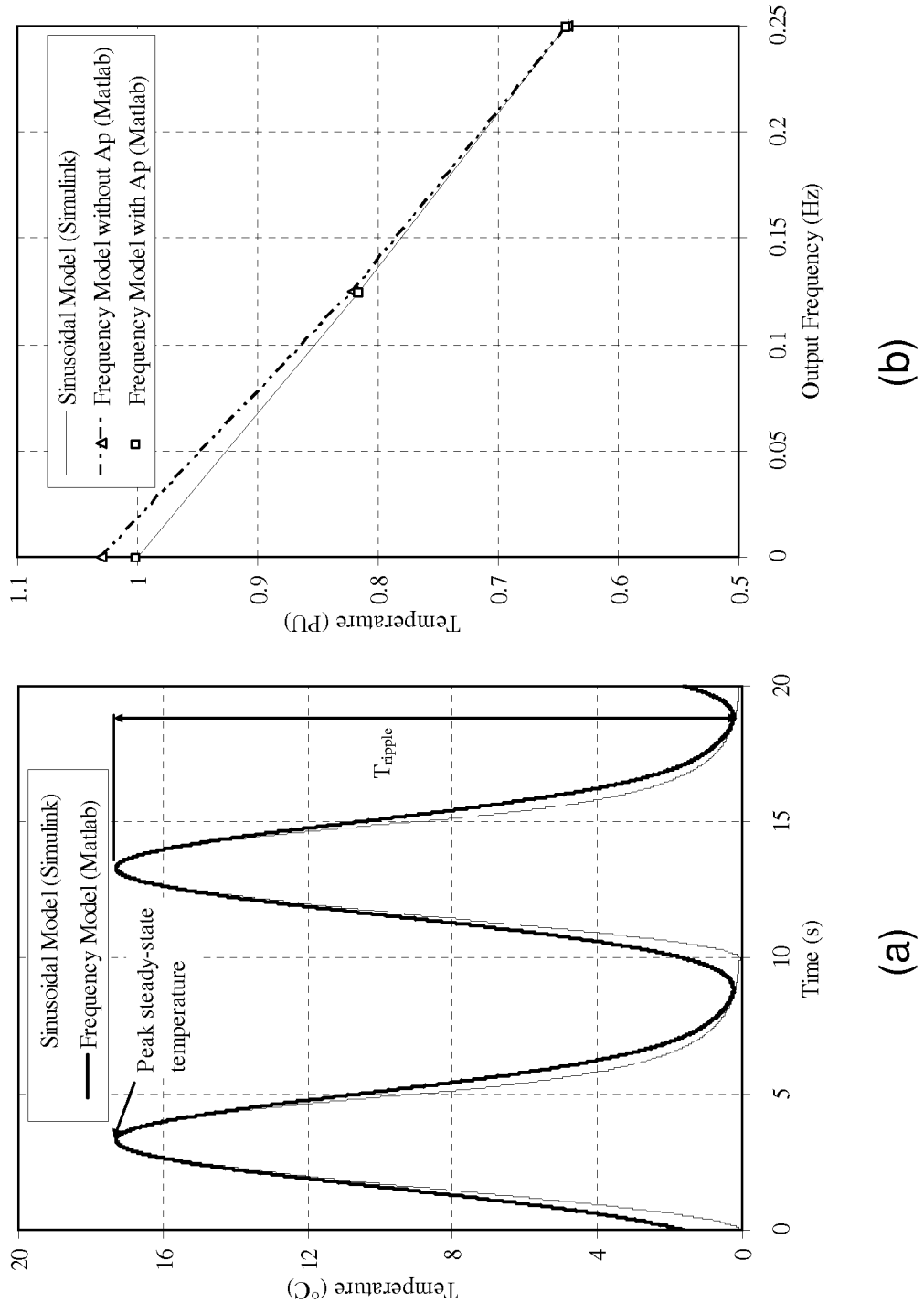
FIG. 8 depicts a comparison of the (a) temperature response for the sinusoidal and frequency models at an output frequency of 0.1 Hz (b) maximum temperature verses output frequency.

This model allows the power loss, output frequency ($\omega 2\pi F_{out}$) and the offset angle ($\alpha$) along with the thermal resistance ($R_{th}$) and the time constant ($\tau$) of the network element to be defined. The temperatures calculated using the frequency model (Matlab) and the sinusoidal approximation (Simulink) are compared using the following parameters:

$R_{th}$=1K/W
t=1 s
$P_{sw}$=20 W
$\omega$=0.628 radians/s or $F_{out}$=1 Hz
$\alpha$=0 radians The steady-state temperature calculated using these parameters are compared in FIG. 8(a). As intended, the peak temperatures are identical and the temperature estimated by the frequency model is never below the sinusoidal response. If the factor $A_p$ were ignored, the peak temperature calculated using the frequency model would have been higher than the sinusoidal response and this effect can be seen in FIG. 8(b). As shown in this figure, as the output frequency is increased the peak magnitude of the frequency model (without $A_p$) tends towards the peak of the sinusoidal response. This effect is caused by the reduction in the magnitude of the higher harmonic terms that have not been included in the frequency model.

In summary, the frequency components developed in this section allow the steady-state temperature response of a Foster network element to be calculated in the frequency domain, when either the switching loss of an IGBT or diode is applied. However, the impact of the conduction loss on the temperature response should not be ignored and the frequency components for this model are developed in the following sections.

1.2.3 Conduction Loss Model

The conduction loss in a device is dependent on the current, displacement angle (θ) and the modulation index (m). However, to develop the conduction loss model, it is initially assumed that the current in a device is sinusoidal (not discontinuous) and the device conducts for the entire switching period, i.e. the duty cycle ($\delta_m$) is unity. Therefore, under this condition, the power loss can be derived in a similar way to the switching loss and will have the same form as Equation 1.11:

$$P_{con(\delta_m=1)}(\omega t) = \hat{P}_{con} \left( \begin{array}{c} \left(\frac{1}{\pi} + A_{p(DC)}\right) + \frac{1}{2}\sin(\omega t + \theta + \alpha) \\ -\left(\frac{2}{3\pi} - A_{p(ac)}\right)\cos(2\omega t + 2\theta + 2\alpha) \end{array} \right) \quad (1.20)$$

where $\hat{P}_{con}$ is the peak conduction loss and for an IGBT this is given by:

$$\hat{P}_{con} = \hat{I}_L V_{CE}(I_L, T_j) \quad (1.21)$$

or for a diode:

$$\hat{P}_{con} = \hat{I}_L V_F(I_L, T_j) \quad (1.22)$$

Figure 9:
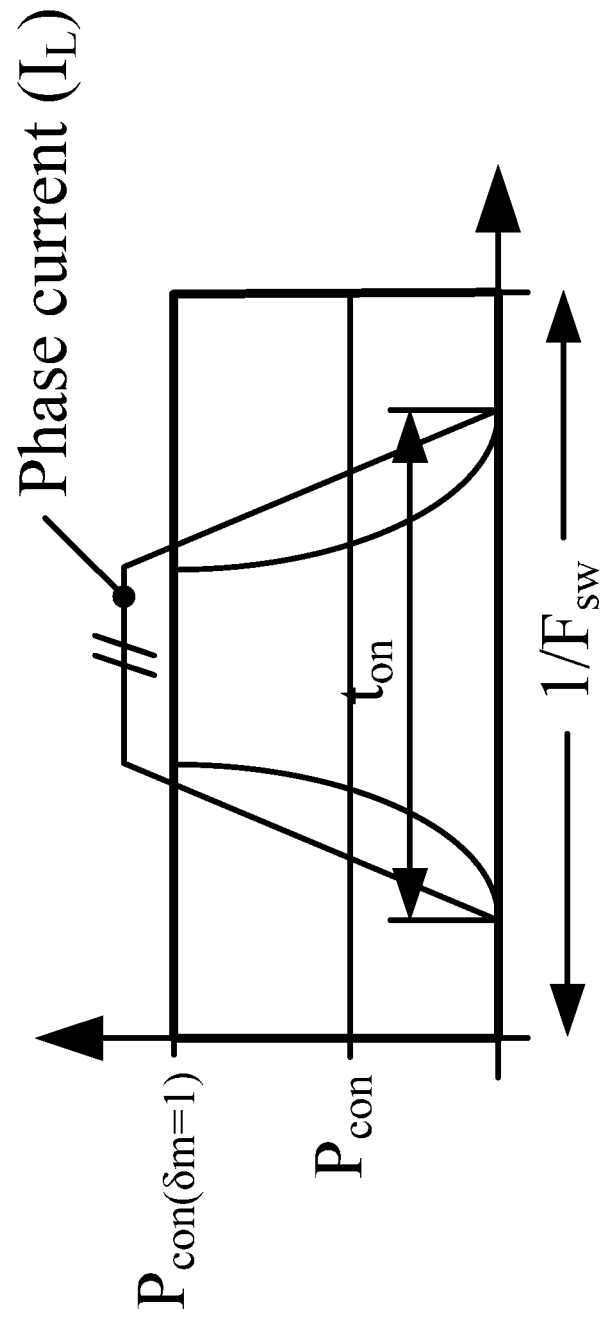
FIG. 9 depicts a conduction power loss over a switching frequency cycle.

However, in order to generate the required output voltage, the on-time ($t_{on}$) of each IGBT in the inverter is modulated and the duty cycle for a device varies over an output cycle. This modulation will have a significant impact on the average conduction loss over the switching period and this is illustrated in FIG. 9.

The average power loss over a switching period ($P_{con}$) is dependent on the conduction loss calculated for a unity duty cycle and the on-time of the device. For a switching frequency cycle, the duty cycle can be defined as:

$$\delta_m = F_{sw} t_{on} \quad (1.23)$$

and the average conduction loss over a switching period can be calculated using:

$$P_{con} = \delta_m P_{con(\delta_m=1)} \quad (1.24)$$

The temperature rise due to the conduction loss in a device is given by:

$$T_{con}(s) = P_{con}(s) Z_{th}(s) \quad (1.25)$$

In order to solve Equation 1.25, a modulation scheme is chosen and the resulting duty cycle is represented by its frequency components. This selection is described in the next section.

1.2.3.1 Modulation Schemes

In a present-day drive, the most common modulation scheme is Space Vector Modulation (SVM). As described, this scheme is based on switching the IGBTs in the inverter to produce eight unique output vectors (voltage) and, by simply changing the time spent at each vector, an output voltage with any magnitude (limited by the DC bus voltage) or angle can be produced. Variations of the SVM scheme are based on the selection of the null vectors and a number of different techniques are compared in (P. J. P. Perruchoud and P. J. Pinewski, "Power losses for space vector modulation techniques," in *Power Electronics in Transportation*, 1996. *IEEE*, 1996, pp. 167-173, incorporated herein by reference). The most popular of these is the Alternating-Reversing (Alt-Rev) sequence. In this scheme, the null vectors are alternated in each sequence and then reversed. When using SVM the duty cycle cannot be calculated using a closed form expression and six equations are used to calculate the duty cycle over the complete output cycle of the inverter. Thus, to calculate the frequency components, an approximation of this scheme is used. Prior to the advent of SVM, the third harmonic modulation scheme was popular due to the increased bus utilisation (R. Valentine, *Motor Control Electronics Handbook*, 1st ed.: McGraw-Hill Professional, 1998, incorporated herein by reference). In this scheme, the duty cycle is calculated using a sine wave modulation with a third harmonic component:

$$\delta_m = 0.5 + \frac{m}{\sqrt{3}}\sin(\omega t + \alpha) + \frac{m}{6\sqrt{3}}\sin(3\omega t + 3\alpha) \quad (1.26)$$

Figure 10:
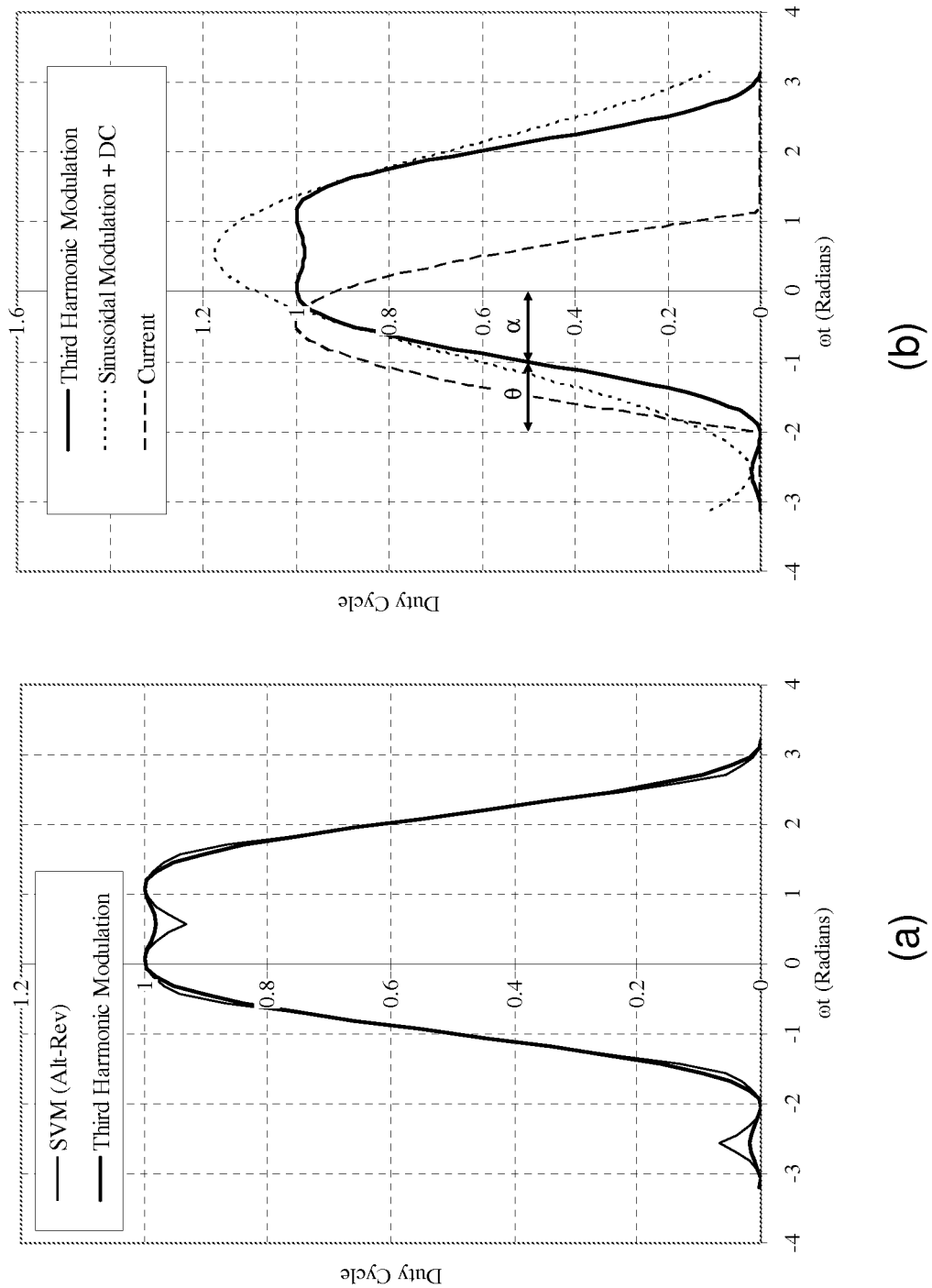
FIG. 10 depicts a comparison of modulation schemes with a unity modulation index (a) SVM (Alt-Rev) and the third harmonic (b) third harmonic and sinusoidal approximation.

The duty cycle calculated using the third harmonic and SVM (Alt-Rev) schemes are compared in FIG. 10(a). From this comparison, it is evident that the duty cycle for both schemes is similar.

If the third harmonic modulation scheme is used to calculate the frequency components for the conduction loss, the solution will have five harmonic terms (i.e. the DC, $1^{st}$ and $2^{nd}$ harmonics in Equation 1.20 combined with DC, $1^{st}$ and $3^{rd}$ harmonics in Equation 1.26). Thus, when compared to the switching loss, more calculations are performed to estimate the corresponding temperature rise. Therefore, the modulation scheme used to calculate the temperature rise due to the conduction loss in a device is:

$$\delta_m = \left(0.5 + \frac{m_{(DC)}A_{F3}}{6\sqrt{3}}\right) + \frac{m}{\sqrt{3}}\sin(\omega t + \alpha) \quad (1.27)$$

This is the same as the third harmonic modulation scheme shown in Equation 1.26, but with the magnitude of the third harmonic term added as a DC component, i.e. the duty cycle is represented by a fundamental and DC component. As with the switching loss model, to avoid overestimating the conduction loss at high output frequencies, the magnitude of the additional DC term is multiplied by the magnitude of a first order filter (Equation 1.17) and in this instance, this is calculated for a third harmonic term (n=3).

The duty cycle calculated using Equation 1.27 (sinusoidal modulation+DC) is shown in FIG. 10(b). As intended, the duty cycle calculated using this approximation is always higher than the third harmonic scheme. Although, if the modulation index is high when the output frequency is low, the peak duty cycle can be greater than unity, which by definition is an impossible operating condition. Consequently, the temperature rise due to the conduction loss can be significantly overestimated. However, this is not a common operating condition for a drive running a motor (low output frequency=low output voltage=low modulation index). Even so, the accuracy of the model can be improved by limiting the maximum temperature using:

$$T_{con} \leq \hat{P}_{con} R_{th}(0.5+0.5m) \quad (1.28)$$

This equation is based on the calculation of the maximum steady-state temperature when operating in a stationary vector condition with a unity displacement power factor, i.e. the temperature calculated when the loss in the device is at its maximum.

1.2.3.2 Steady-State Temperature Response

The steady-state frequency components for the conduction loss model are shown in Table 1.2. These can be used to calculate the temperature rise of an IGBT or diode with any displacement power factor or modulation index; although for an anti-parallel diode the duty cycle is normally defined as:

$$\delta_{m(Diode)} = 1 - \delta_{m(IGBT)} \quad (1.29)$$

However, unlike the standard modulation schemes, the DC component in Equation 1.27 is greater than 0.5. Thus, only the fundamental component in this equation is made negative:

$$\delta_{m(IGBT)} = \left(0.5 + \frac{m_{(DC)}A_{F3}}{6\sqrt{3}}\right) - \frac{m}{\sqrt{3}}\sin(\omega t + \alpha) \quad (1.30)$$

Therefore, to calculate the temperature of a diode using the equations outlined in Table 1.2, the modulation index (m) is defined as a negative value, while the term $m_{(DC)}$ remains positive for an IGBT or diode. As with the switching loss model, the magnitude of the sin and cos components for each harmonic can be combined into a single term. Thus, the ripple temperature due to the conduction loss is given by:

$$T_{ripple(con)} = \begin{pmatrix} A_{con1}\cos(\omega t + \sigma_1) + \\ A_{con2}\cos(2\omega t + 2\sigma_2) + \\ A_{con3}\cos(3\omega t + 3\sigma_2) \end{pmatrix} \quad (1.31)$$

TABLE 1.2

Frequency components for the device conduction loss

| Frequency Component | Magnitude | |
|---|---|---|
| DC | $A_{DC}$ | $\hat{P}_{con}R_{th}\left[\frac{m}{4\sqrt{3}}\cos(\theta) + \left(\frac{1}{\pi} + A_{P(DC)}A_{F(DC)}\right)\left(\frac{1}{2} + \frac{m_{(DC)}A_{F3}}{6\sqrt{3}}\right)\right]$ |
| $\sin(\omega t)$ | $A_{s1}$ | $\hat{P}_{con}R_{th}A_{F1}\begin{bmatrix}\frac{1}{2}\left(\frac{1}{2} + \frac{m_{(DC)}A_{F3}}{6\sqrt{3}}\right)\cos(\theta + \alpha + \beta) + \\ \left(\frac{2}{3\pi} - A_{P(ac)}\right)\frac{m}{2\sqrt{3}}\cos(2\theta + \alpha + \beta) + \\ \left(\frac{1}{\pi} + A_{P(DC)}A_{F(DC)}\right)\frac{m}{\sqrt{3}}\cos(\alpha + \beta)\end{bmatrix}$ |
| $\sin(2\omega t)$ | $A_{s2}$ | $\hat{P}_{con}R_{th}A_{F2}\begin{bmatrix}\left(\frac{2}{3\pi} - A_{P(ac)}\right)\left(\frac{1}{2} + \frac{m_{(DC)}A_{F3}}{6\sqrt{3}}\right)\sin(2\theta + 2\alpha + \beta) + \\ \frac{m}{4\sqrt{3}}\sin(\theta + 2\alpha + \beta)\end{bmatrix}$ |
| $\sin(3\omega t)$ | $A_{s3}$ | $-\hat{P}_{con}R_{th}A_{F3}\left(\frac{2}{3\pi} - A_{P(ac)}\right)\frac{m}{2\sqrt{3}}\cos(2\theta + 3\alpha + \beta)$ |
| $\cos(\omega t)$ | $A_{c1}$ | $\hat{P}_{con}R_{th}A_{F1}\begin{bmatrix}\frac{1}{2}\left(\frac{1}{2} + \frac{m_{(DC)}A_{F3}}{6\sqrt{3}}\right)\sin(\theta + \alpha + \beta) + \\ \left(\frac{2}{3\pi} - A_{P(ac)}\right)\frac{m}{2\sqrt{3}}\sin(2\theta + \alpha + \beta) + \\ \left(\frac{1}{\pi} + A_{P(DC)}A_{F(DC)}\right)\frac{m}{\sqrt{3}}\sin(\alpha + \beta)\end{bmatrix}$ |
| $\cos(2\omega t)$ | $A_{c2}$ | $-\hat{P}_{con}R_{th}A_{F2}\begin{bmatrix}\left(\frac{2}{3\pi} - A_{P(ac)}\right)\left(\frac{1}{2} + \frac{m_{(DC)}A_{F3}}{6\sqrt{3}}\right)\cos(2\theta + 2\alpha + \beta) + \\ \frac{m}{4\sqrt{3}}\cos(\theta + 2\delta + \beta)\end{bmatrix}$ |
| $\cos(3\omega t)$ | $A_{c3}$ | $-\hat{P}_{con}R_{th}A_{F3}\left(\frac{2}{3\pi} - A_{P(ac)}\right)\frac{m}{2\sqrt{3}}\sin(2\theta + 3\alpha + \beta)$ |

1.2.3.2.1 Comparison of the Temperature Response

Figure 11:
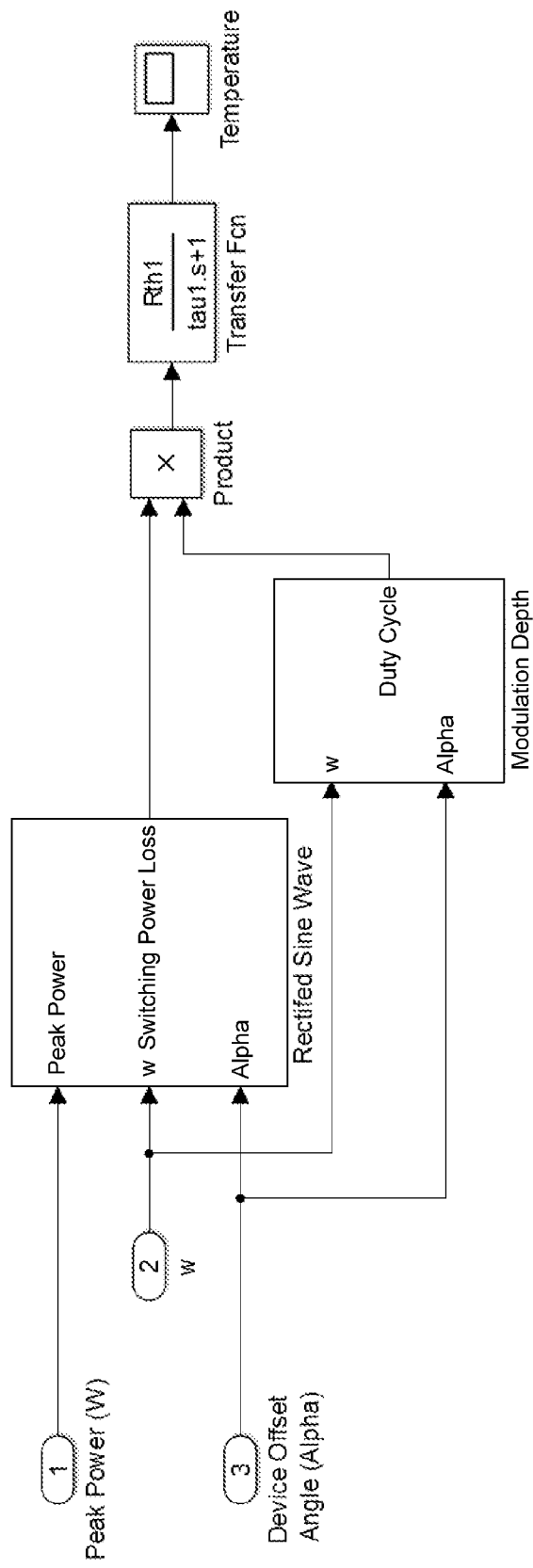
FIG. 11 depicts a simulink sinusoidal conduction loss model.

The equations developed for the conduction loss (Table 1.2) are implemented in Matlab (or other suitable software) and the response of this model is compared with the sinusoidal approximation, which is calculated using Simulink (or other suitable software). The Simulink model for the conduction loss is shown in FIG. 11. To compare the temperature response the duty cycle in this model is calculated using the standard third harmonic modulation scheme given in Equation 1.26. The operating parameters used in this comparison are the same as those used to compare the switching loss models in Section 1.2.2.2, although for the conduction loss model the following displacement power factor and modulation index are used:

DPF=0.707 (lagging)

m=0.5

Figure 12:
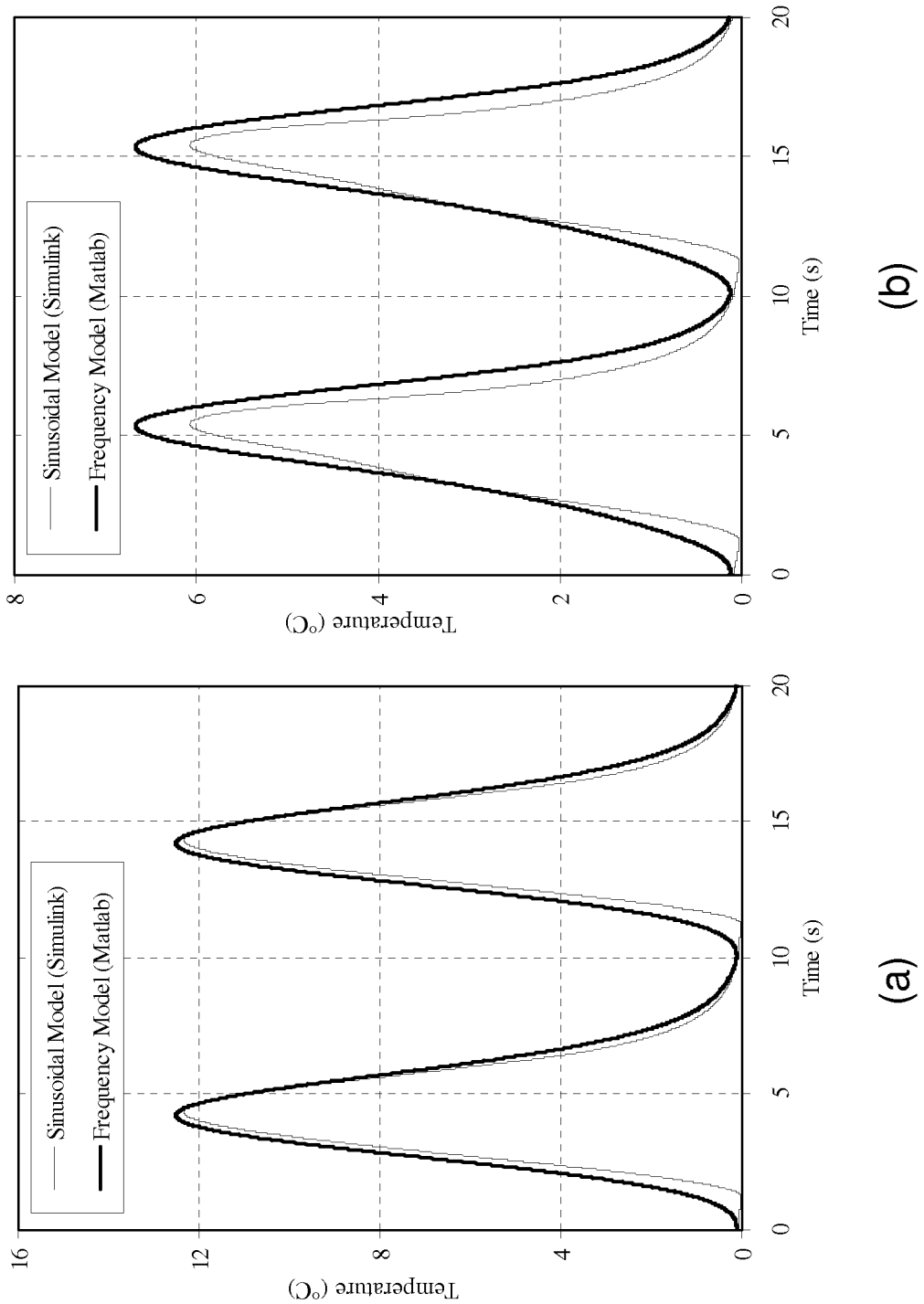
FIG. 12 depicts a temperature response of the sinusoidal and frequency models with an output frequency of 0.1 Hz (a) IGBT (b) anti-parallel diode.

In an inverter the maximum conduction loss will occur when a device conducts the peak current for the maximum length time. For an IGBT this occurs when the displacement power factor (DPF) is unity. However, as shown by Equation 1.29, in this condition an anti-parallel diode will only conduct for a short period. Therefore, unlike the switching loss, the chosen operating conditions will have a different impact on the response for an IGBT and diode. The comparison of the steady-state temperatures are shown in FIG. 12.

As expected, even though both devices have the same thermal characteristics, with a displacement power factor of 0.707 the resulting temperature rise in the IGBT is higher than the anti-parallel diode. Once again, because of the selection of the frequency components used to represent the current and duty cycle, it can be seen that the temperature response calculated using the frequency model is always higher than the Simulink model. Although for the conduction loss the peak temperature is overestimated. This is caused by the combined effect of the approximated power loss and duty cycle in the region where the peak power loss occurs, i.e. the instantaneous power loss is overestimated.

In summary, the frequency components for the switching loss (Table 1.1) and conduction loss (Table 1.2) models have been developed. However, in order to implement these equations the output angle of the inverter ($\omega t$) should still be known. Therefore, the frequency components are used to calculate the peak steady-state temperature over a complete output cycle of the inverter. This temperature will then become the output of the steady-state frequency model. The method used to calculate the peak temperature is described in the following sections.

1.3 Calculation of the Peak Ripple Temperature

The peak ripple temperature is calculated from the sum of the fundamental and harmonic components. The magnitude and phase of these components is dependent on a number of input variables, including the peak power loss, modulation index, displacement power factor, output frequency and the thermal properties of the network element. This is a complex problem and one that cannot be solved directly using standard trigonometric relationships. Therefore, a method that can be used to estimate the angle ($\omega t$) where the peak temperature occurs is desired, in which it is possible to implement the chosen method efficiently in a microprocessor.

1.3.1 Taylor Series Approximation of the Peak Ripple Temperature

The method described in this section is based on the approximation of the frequency components by an equivalent Taylor series. In order to calculate the peak of the complete temperature response, the frequency components for the switching and conduction loss are first combined. The resulting ripple temperature will consist of the fundamental and second harmonic terms due to the combined effect of the switching and conduction loss, and a third harmonic due entirely to the conduction loss. However, as shown in Table 1.2, the magnitude of the third harmonic is much smaller than the other terms and to simplify the calculation, the third harmonic is treated as a constant value:

$$T_{ripple} = A_1 \cos(\omega t + \sigma_1) + A_2 \cos(2\omega t + 2\sigma_2) + A_3 \quad (1.32)$$

where $A_n$ is the magnitude of the $n^{th}$ harmonic due to the combination of the components in the switching and conduction loss models. To represent the harmonic terms by a Taylor series approximation they are represented in the form:

$$A_n \cos(n\omega t + n\sigma_n) = A_n[\cos(\omega t)\cos(n\sigma_n) - \sin(\omega t)\sin(n\sigma_n)] \quad (1.33)$$

The Taylor series approximation of the general harmonic term, using only the first two terms in the series for the sin and cos components, is then given by:

$$A_n \cos(n\omega t + n\sigma_n) = A_n \left[ \begin{array}{c} \left(1 - \frac{(n\omega t)^2}{2!}\right)\cos(n\sigma_n) \\ -\left(n\omega t - \frac{(n\omega t)^3}{3!}\right)\sin(n\sigma_n) \end{array} \right] \quad (1.34)$$

From this expression, the location of the turning points can be found by solving:

$$\frac{d}{d\omega t} A_n \cos(n\omega t + n\sigma_n) = 0 \quad (1.35)$$

For the Taylor series approximation in Equation 1.34, the turning points are found by solving:

$$A_n \left[ \left(-\frac{2n^2(\omega t)}{2!}\right)\cos(n\sigma_n) - \left(n - \frac{3n^3(\omega t)^2}{3!}\right)\sin(n\sigma_n) \right] = 0 \quad (1.36)$$

By limiting the Taylor series approximation to the first two terms, it can be seen that Equation 1.36 is a quadratic and this can be expressed in the form:

$$a(\omega t)^2 + b\omega t + c = 0 \quad (1.37)$$

This equation has two turning points and these can be found using the standard quadratic formula:

$$\omega t = \frac{-b \pm \sqrt{b^2 - 4ac}}{2a} \quad (1.38)$$

As shown in Equation 1.32, the ripple temperature has two harmonic components and to calculate the turning points the coefficients of the quadratic equation for the fundamental (n=1) and second harmonic (n=2) terms are combined. Thus, the coefficients for the full response (ignoring the third harmonic component) are:

$$a = \sum_{n=1}^{2} \frac{A_{sn} n^3}{2} \sin(n\sigma_n) \quad (1.39)$$

$$b = -\sum_{n=1}^{2} A_{sn} n^2 \cos(n\sigma_n) \qquad (1.40)$$

$$c = -\sum_{n=1}^{2} A_{sn} n \sin(n\sigma_n) \qquad (1.41)$$

The two turning points are calculated by substituting these coefficients into Equation 1.38. To identify which of the turning points is the minimum ($\omega t_{min}$) and maximum ($\omega t_{max}$), the coefficients and the turning points can then be substituted into the derivative of Equation 1.36, which can be represented in the form:

$$2a(\omega t)+b \qquad (1.42)$$

Figure 13:
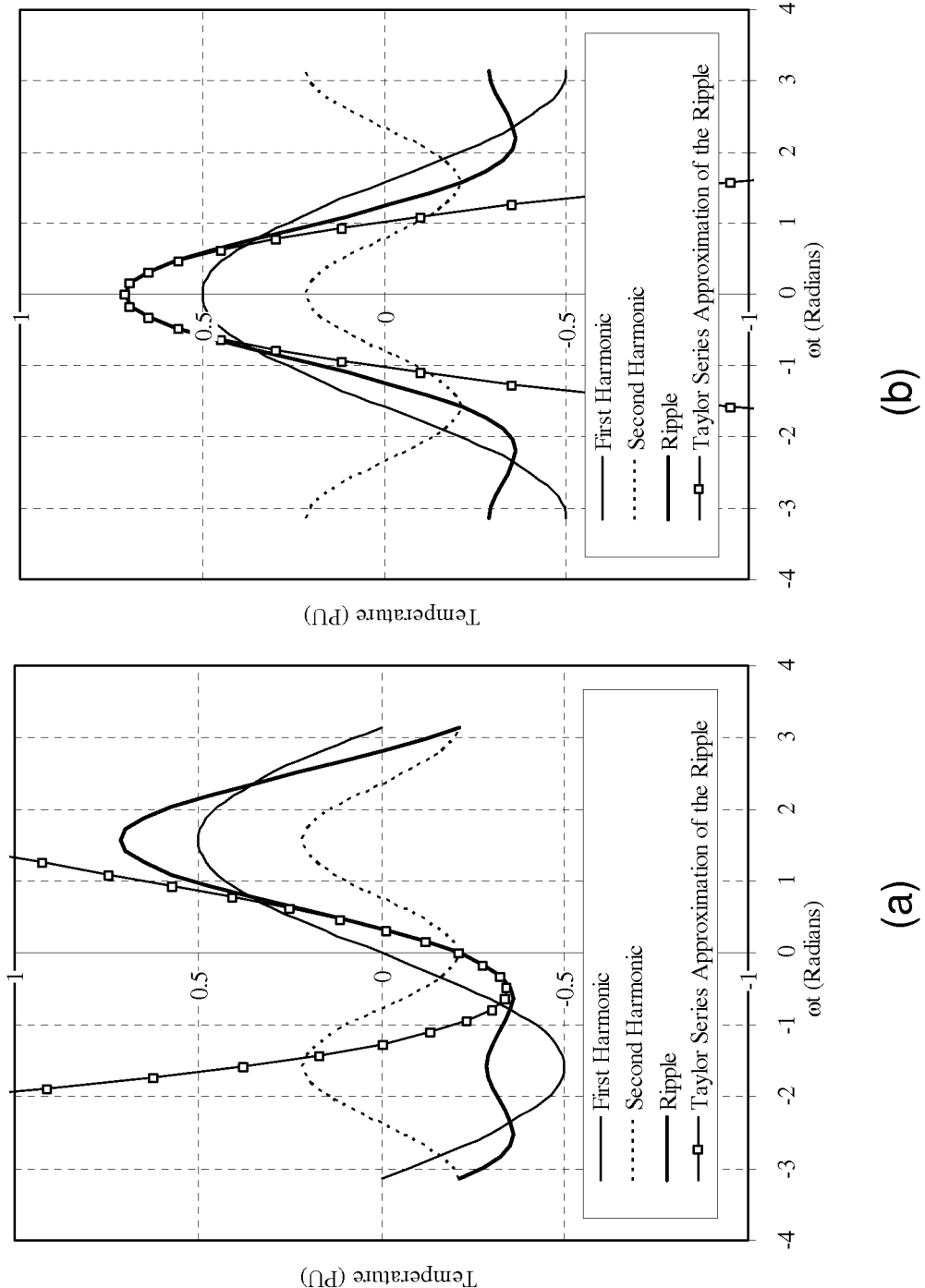
FIG. 13 depicts a Taylor series approximation of the ripple temperature with the peak ripple at an output angle of (a) $\omega t = \pi/2$ (b) $\omega t = 0$.

If the result of this calculation is positive, the turning point is the maximum. The procedure outlined above is used to determine the location of the peak ripple, and in order to calculate the actual peak ripple temperature, this location ($\omega t_{max}$) is substituted into Equation 1.32. However, by using only the first two terms of the Taylor series the accuracy of the approximated ripple temperature falls as the output angle of the inverter moves away from the origin ($\omega t=0$). By definition, when the inverter is operating in a stationary vector condition with a unity displacement power factor, the peak temperature will occur at an output angle of $\omega t=\pi/2$. Therefore, as shown in FIG. 13(*a*), the Taylor series approximation cannot be used to calculate the peak ripple temperature in this condition.

Consequently, in order to use this approach, the phase angles ($\sigma_1$ and $\sigma_2$) of the harmonics in Equation 1.32 are modified (maintaining the same phase relationship between the 1$^{st}$ and 2$^{nd}$ harmonics) so that the peak ripple occurs near the origin. The effect of this process on the accuracy of the Taylor series approximation can be seen in FIG. 13(*b*). In this figure, the harmonics have been shifted so that the peak ripple occurs when $\omega t=0$. The results show that the peak ripple calculated using the frequency components and the Taylor series approximation is identical. Therefore, the phase shift used to ensure that the peak ripple occurs near the origin is to be calculated. This procedure is described below.

In any operating condition the peak of the ripple temperature will occur between the positive peaks of the first and second harmonics that are closest together, i.e. the peaks with the smallest angle between them. The two angles ($\phi_1$ and $\phi_2$) between the peaks are calculated using the phase angles for the combined response:

$$\phi_1=\sigma_1-\sigma_2 \qquad (1.43)$$

$$\phi_2=\phi_1+\pi \qquad (1.44)$$

Figure 14:
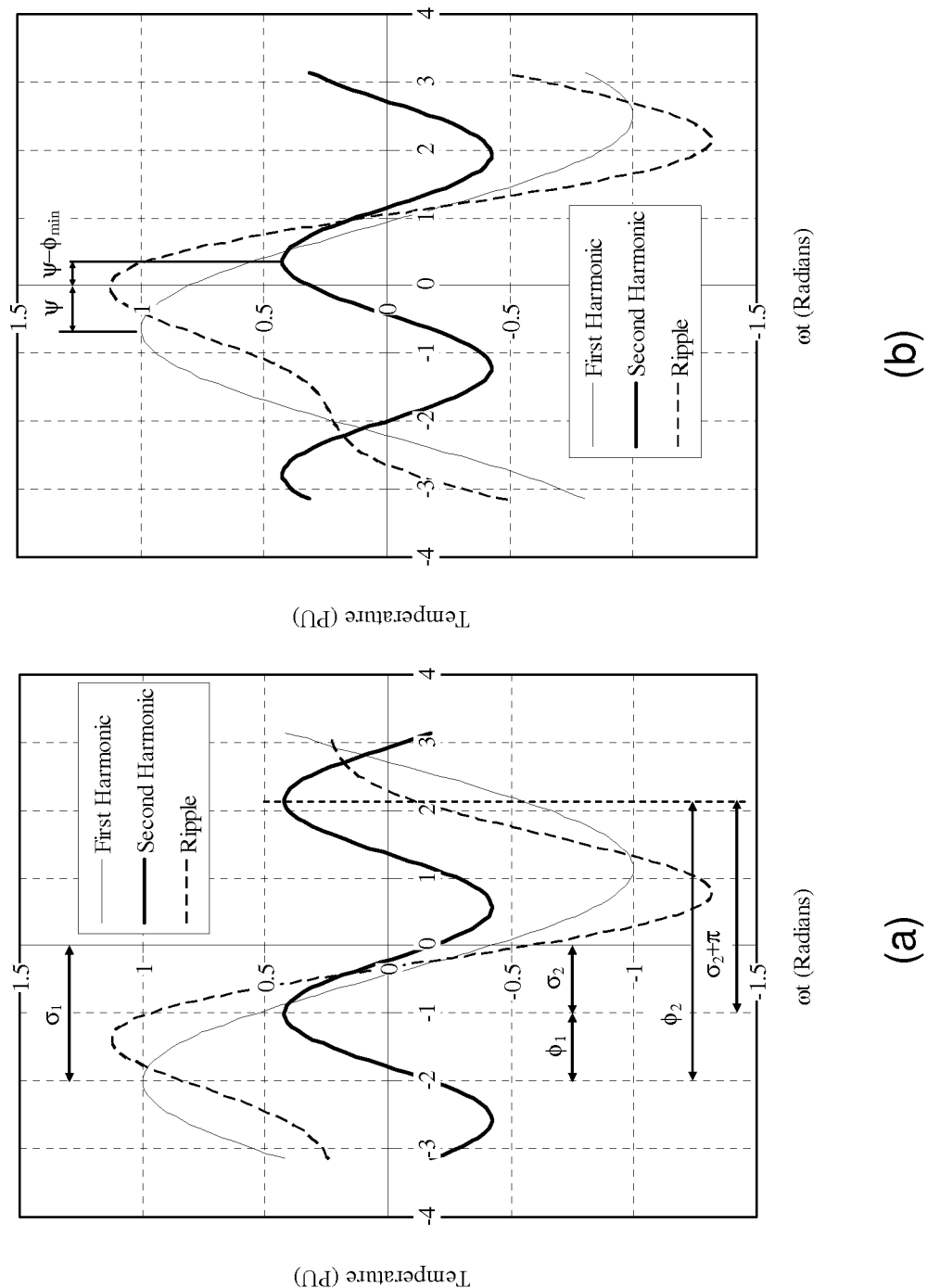
FIG. 14 depicts a Taylor series approximation (a) angles between peaks of the harmonic components (b) offset angles used to align the peak ripple with the origin.

The angles for a general operating condition where the peaks of the first and second harmonics are not in phase are shown in FIG. 14(*a*). By selecting the smallest angle ($\phi_{min}$), the angle where the peak ripple occurs can be approximated using:

$$\psi = \phi_{min} \frac{1.5 A_2}{A_1} \qquad (1.45)$$

Therefore, the fundamental and second harmonic terms are shifted using the angles $\psi$ and $\psi-\phi_{min}$. This process is illustrated in FIG. 14(*b*). For the frequency components in this figure, $\omega t_{max}$ will be close to zero and the ripple temperature is calculated using:

$$T_{ripple}=A_1 \cos(\omega t+\psi)+A_2 \cos(2\omega t+2[\psi-\phi_{min}])+A_3 \qquad (1.46)$$

In summary, the peak ripple temperature is calculated using the following steps:

1. Calculate the smallest angle ($\phi_{min}$) between the positive peaks for the first and second harmonics (Equation 1.32).
2. Use this angle to determine the phase shift for the first harmonic ($\psi$).
3. Calculate the phase shift for the second harmonic required to maintain the same phase relationship ($\psi-\phi_{min}$) as the original response.
4. Calculate the coefficients of the quadratic formula for the frequency model with the new phase shifts (Equation 1.46).
5. Use the quadratic formula to calculate the two turning points and identify which of these is the peak ($\omega t_{max}$).
6. Substitute $\omega_{max}$ into Equation 1.46 and calculate the peak ripple temperature.

To check the accuracy of the Taylor series approximation, it is used to calculate the peak ripple for the following ripple temperature:

$$T_{ripple}=A_1 \cos(\omega t)+A_2 \cos(2\omega t+2\sigma_2) \qquad (1.47)$$

Using the approximation the peak ripple temperature is calculated over the full range of possible magnitudes ($A_2=0$ to $A_1$) and phase shifts ($\sigma_2=0$ to $2\pi$) and this is compared with the true peak temperature determined from a Simulink model. From this investigation it was found that for all possible operating conditions, the maximum error in the estimated peak temperature is less than 1%. However, this comparison only validates the method used to calculate the peak ripple temperature and does not show the effects of ignoring the third harmonic term or the assumptions used to generate the frequency components. Therefore, in the next section, the peak temperature estimated by the frequency model (using the Taylor series approximation) is compared against the peak temperature calculated using the initial sinusoidal approximation in various operating conditions.

1.4 Comparison of the Peak Temperature in a Steady-State Operating Condition

The impact of any approximations made during the development of the frequency model is investigated in this section. As shown in Equation 1.32, in order to use the Taylor series approximation to calculate the peak ripple temperature, the magnitude of the third harmonic term is treated as a constant value. This assumption, combined with the approximation of the duty cycle and power loss, will have an impact on the accuracy of the estimated peak temperature. To show the effect of these approximations, the peak steady-state temperature is calculated using the frequency model and this temperature is given by:

$$\hat{T}_{ss}=T_{dc}+\hat{T}_{ripple} \qquad (1.48)$$

Figure 15:
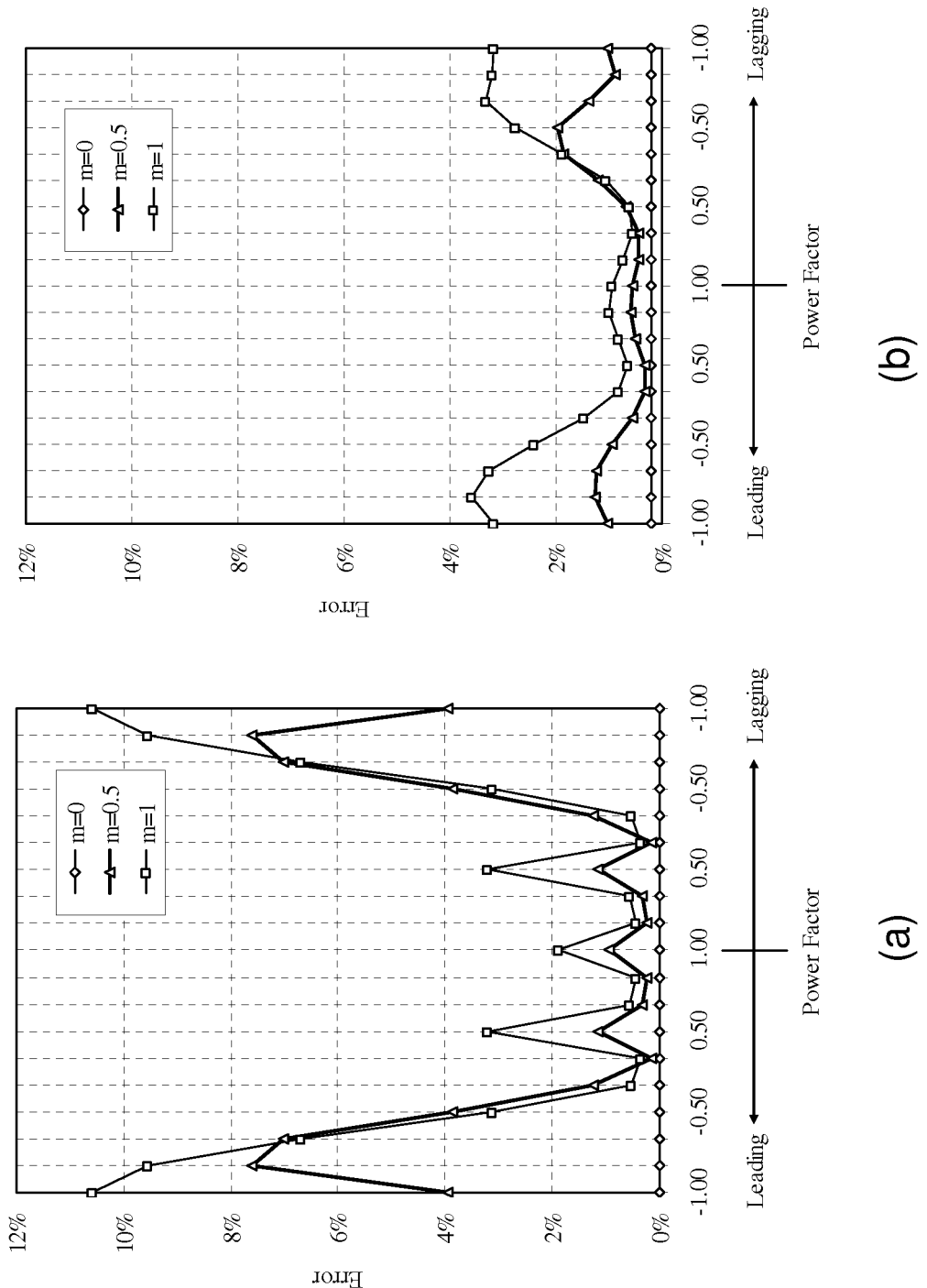
FIG. 15 depicts a comparison of the peak temperature calculated for an IGBT ($\tau_{th}$=1 s) using the frequency model and the instantaneous sinusoidal approximation at an output frequency of (a) 0 Hz (stationary vector condition) (b) 1 Hz.

Using this equation, the temperature is calculated over the full range of the modulation index (m=0 to 1) with a leading and lagging displacement power factor. This is then compared with the peak instantaneous temperature calculated using the sinusoidal approximation (Simulink model). The results from this comparison are represented as a percentage of the peak instantaneous temperature and a positive value indicates that the temperature is overestimated by the frequency model, but the devices are protected. The results for an IGBT operating at 0 Hz (in a stationary vector condition) and at an output frequency of 1 Hz are shown in FIG. 15(*a*) and FIG. 15(*b*) respectively. The operating conditions used to generate these results are the same as those used in the comparison of the switching loss model in section 1.2.2.2.

When operating in a stationary vector condition with a modulation index of zero, the approximation of the duty cycle and the peak power loss in both models are the same, i.e. the duty cycle is 0.5 over the complete output cycle of the inverter. Consequently, since the peak power loss is correct there is no error in this condition. However, due to the approximations used to generate the frequency components, the error increases as the modulation index approaches unity and the displacement power factor becomes negative.

Figure 16:
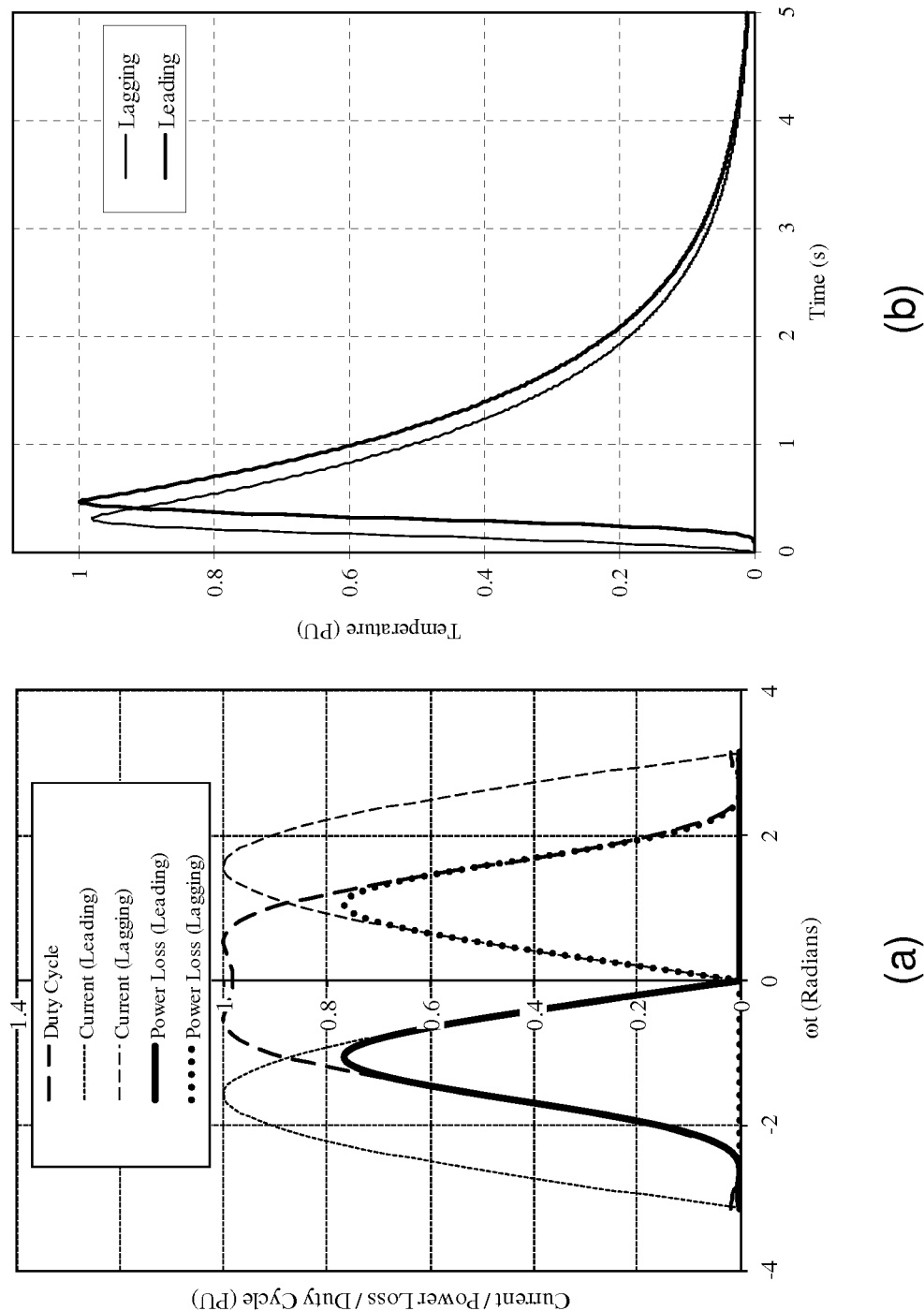
FIG. 16 depicts a comparison of the power loss and the resulting temperature rise for a leading and lagging displacement power factor of 0.5 (a) current, duty cycle and power loss (b) temperature rise due to the power loss over a single output cycle of the inverter.

As the output frequency of the inverter is increased, the harmonic components will no longer be in phase. Therefore, in this condition, treating the third harmonic as a constant value (Equation 1.32) will contribute towards the total error. In FIG. 15(b), it can be seen that at an output frequency of 1 Hz there is a small error when the modulation index is zero. This is caused by the decay of the higher harmonics that are not included in the approximation of the power loss. As a result, there is a small difference (~0.2%) between the magnitudes of the peak loss in both models which was not shown in FIG. 8(b). Furthermore, the errors calculated with a leading and lagging displacement power factor are different. This characteristic is caused by the shape of the power loss that is applied to the Foster network element which is dependent on the displacement power factor. An example of the conduction loss calculated for a leading and lagging displacement power factor of 0.5 is shown in FIG. 16(a).

This figure shows that the area of the power loss calculated with a leading and lagging displacement power factor is identical. However, for a leading displacement power factor, the area between the initial rise in the power loss and the peak value is slightly larger. Consequently, as shown in FIG. 16(b), the peak temperature calculated with a leading displacement power factor is higher. These results highlight how the shape of the power loss and therefore the displacement power factor can have an impact on the device temperature.

Overall, the results described in this section show that the accuracy of the steady-state temperature calculated in the key operating conditions for the inverter is acceptable and importantly, the temperature of a device is never underestimated by the frequency model. However, the transient response due to changes in the power loss and output frequency should not be ignored. A transient model is developed in the next section.

1.5 Summary

The temperature calculated using this method forms the basis of the thermal model and this approach, when compared to a model implemented in the time domain, has several key advantages. These include the following:

1. A reduction in the number of calculations that are performed on-line, which allows the model to be implemented at a moderate sample frequency while being capable of estimating the temperature at high fundamental output frequencies.

2. The ability to estimate the temperature under a wide range of operating conditions using minimal computational resources.

3. The adaptability of the model, which when combined with the principles of linear superposition can be used to model a complete inverter.

2 Implementation of the Thermal Model in a Three Phase Inverter 2.1 Introduction In the previous section, the temperature estimated by the frequency model was compared against the instantaneous response calculated for a single element of a Foster network. One or more of these network elements can be used to represent the thermal characteristics (thermal impedance) measured between the junction of a device and a defined reference point, typically the external ambient temperature ($T_a$) or the temperature measured by the internal thermistor ($\tau_{th}$) in the power module. However, the thermal coupling between each device in an inverter can have a significant impact on the temperature of any neighbouring devices. Thus, to model the devices in an inverter the self and mutual transient thermal impedances are used and these are defined as:

Self thermal impedance—represents the change in the temperature between the junction of a device (i) and a reference point due to its own power loss.

Mutual thermal impedance—represents the change in the temperature between the junction of a device (i) and a reference point due to a power loss applied to another device (j) in the inverter.

To calculate the temperature of a single device in the inverter (six IGBTs and diodes) the frequency components in the switching and conduction loss models are calculated for each element in the equivalent Foster networks. For an inverter these include the eleven mutual thermal impedances associated with the device being modelled. However, the magnitude of the sine and cosine components calculated for each network element (at the same frequency) can be added together and combined into a single term. This allows the peak steady-state temperature to be calculated using the method developed for a single element (i.e. the Taylor series approximation). This procedure is described in section 2.2.

Although the frequency model could be used to calculate the temperature of every device in the inverter, including the effect of the self and mutual thermal impedances, the number of calculations that can be performed is limited by the available computational resources. Consequently, in order to allow the model to be implemented in a drive, some level of simplification is desired, and this is described in the remainder of the section. In order to evaluate these simplifications, a model of a typical power module is developed in Flotherm (or other suitable software) and this is described in section 2.3. This model is used to calculate all of the self and mutual transient thermal impedances (144 values) for the inverter. The equivalent Foster network for each of these impedances is then used to form the complete thermal impedance matrix, which is used to calculate the instantaneous temperature of every device under a range of operating conditions. The temperature calculated using the thermal impedance matrix is then used to identify the devices in the inverter that have the greatest risk of overheating. To protect the inverter, the temperature of these devices is then estimated using the frequency model. In section 2.3.1, this procedure is outlined using the temperature calculating in a stationary vector condition. The temperature of one of the chosen devices is then compared against the instantaneous response over a complete output cycle of the inverter and this comparison is shown in section 2.3.2.

The simplifications used to implement the frequency model are reviewed in section 2.4 and these include the following approximations:

1. The temperature of a device is calculated using only the self thermal impedance, and any thermal coupling that exists between the devices in the inverter is ignored (section 2.4.1).

2. The temperature of a single IGBT and diode is calculated using the self and mutual thermal impedances, and it is assumed that in any operating conditions, either the chosen IGBT or diode is the hottest device in the inverter (section 2.4.2).

To implement the frequency model, the parameters of an equivalent Foster network are calculated for every one of the thermal impedances in the simplified model and these are reviewed in section 2.5. The number of elements in each of these networks is defined in section 2.5.1, while methods that can be used to reduce the number of networks are discussed in section 2.5.2. Finally, the implementation of the frequency model in a commercial drive control system, including a definition of the input, feedback and calculated parameters, is reviewed in section 2.6.

Figure 17:
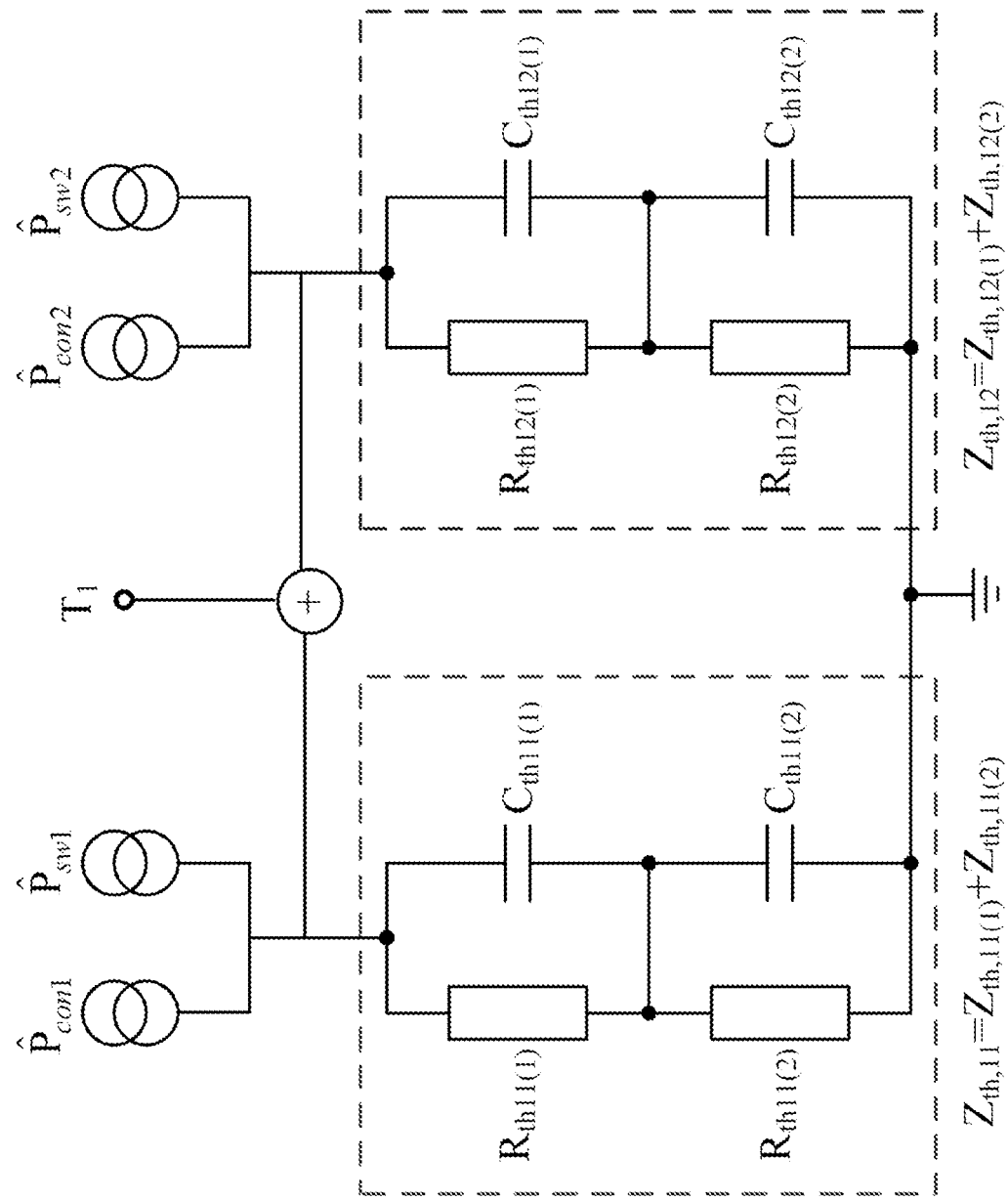
FIG. 17 depicts a superposition of the self and mutual thermal impedance.

2.2 Implementation of the Frequency Model for a System Represented by Multiple Foster Network Elements Using superposition, the frequency model developed for a single element of a Foster network can be used to calculate the temperature response due to the self ($\alpha=0$) and mutual ($\alpha\neq 0$) thermal impedances in an inverter. To describe this process, the steady-state temperature is calculated for a basic system with two devices (p=2). In this, the self and mutual thermal impedances are represented by an equivalent network with two elements (k=2). Each of these elements has a unique thermal resistance ($R_{th}$), thermal capacitance ($C_{th}$) and time constant ($\tau_{th}=R_{th}C_{th}$). The method used to calculate the temperature of device 1 ($T_1$) is illustrated in FIG. 17.

To calculate the temperature, the magnitude of each term in the frequency model for the switching loss (Table 1.1) and conduction loss (Table 1.2) are calculated for each network element. In order to do this, the terms for the self thermal impedance ($Z_{th,11}$) are calculated using the corresponding peak power losses for device 1, while the terms for the mutual thermal impedance ($Z_{th,12}$) are calculated using the losses for device 2. Therefore, given that there are four network elements and two peak losses, each term ($A_{s1}$, $A_{c1}$, etc.) in the complete frequency model is calculated eight times. By separating each of the harmonics in the frequency model into its sine and cosine components, the effect of the phase shift, which will be different for each element, is included in the magnitude of these components. Consequently, the magnitude of the like terms calculated for each element can be added together directly. For example, in the switching loss model the magnitude of the fundamental term $A_{s1}$ (taken from Table 4.1) calculated for the first element of the self thermal impedance is given by:

$$A_{s1(sw),11,(1)} = \frac{\hat{P}_{sw} R_{th,11(1)} A_{F1}}{2} \cos(\theta + \alpha + \beta) \quad (2.1)$$

where $A_{F1}$ and $\beta$ are both dependent on the time constant $\tau_{th,11(1)}$. Therefore, for the four network elements in this model, the total magnitude of this term is:

$$A_{s1(sw)} = \sum_{j=1}^{p} \sum_{m=1}^{k} A_{s1(sw),1j(m)} = \quad (2.2)$$

$$A_{s1(sw),11(1)} + A_{s1(sw),11(2)} + A_{s1(sw),12(1)} + A_{s1(sw),12(2)}$$

where $A_{s1(sw),1j(m)}$ is the magnitude calculated for element m of the thermal impedance $Z_{th,1j}$. Hence, in the complete model, the magnitude of the sin component for the $n^{th}$ harmonic is calculated using:

$$A_{sn(sw+con)} = \sum_{j=1}^{p} \sum_{m=1}^{k} A_{sn(sw),1j(m)} + \sum_{j=1}^{p} \sum_{m=1}^{k} A_{sn(con),1j(m)} \quad (2.3)$$

Once every term in the frequency model has been calculated, the sine and cosine components for the first and second harmonics can be combined and, as for a single element, the ripple temperature (ignoring the third harmonic component) is given by:

$$T_{ripple(sw+con)} = A_{1(sw+cos)} \cos(\omega t + \sigma_1) + A_{2(sw+con)} \cos(2\omega t + 2\sigma_2) \quad (2.4)$$

where $A_{n(sw+con)}$ is the magnitude of the combined sine and cosine components for the $n^{th}$ harmonic and $\sigma_n$ is the resultant phase shift. Using this process, the ripple component of the complete response for any number of devices or network elements can be represented by just two harmonic terms, and the peak of this ripple can be calculated using the Taylor series approximation. Therefore, the frequency model can now be used to calculate the steady-state temperature of one or more devices in an inverter.

2.3 Development of a Frequency Model for an Inverter

A separate frequency model could be used to estimate the temperature of every device in an inverter. However, this is not possible due to the limited computational resources. Furthermore, in order to protect all of the devices it is only necessary to calculate the temperature of the hottest device. The hottest device is dependent on the operating conditions and the thermal properties, including the thermal coupling between each device, which is dependent on the layout (chip positions) and configuration (one or more power modules) of the inverter. Therefore, to develop the frequency model, the complete thermal impedance matrix is used, and although any values could be used, they should have similar characteristics to an actual power module. Consequently, the frequency model is developed using the transient thermal impedances determined using the model of a typical power module implemented in the simulation package Flotherm (or other suitable software). A diagram of this model showing the position of each device can be seen in FIG. 1.

Although the power module used in this simulation contains a rectifier, inverter and brake, the frequency model has been developed to protect only the devices in an inverter. Thus, the Flotherm model is used to generate the typical self and mutual transient thermal impedance curves for the six IGBTs and freewheeling diodes (p=12). These are represented by an equivalent Foster network, which form the complete thermal impedance matrix for the inverter:

$$[Z_{th,j-ref}] = \begin{bmatrix} Z_{th,11} & \cdots & Z_{th,1p} \\ \vdots & \ddots & \vdots \\ Z_{th,i1} & \ddots & Z_{th,ip} \\ \vdots & & \ddots & \vdots \\ Z_{th,p1} & \cdots & Z_{th,pp} \end{bmatrix} \quad (5.5)$$

Using the simulation model, the thermal impedances can be calculated between the junction of a device ($T_j$) and any reference point. In practice, most models that have been developed use the ambient temperature ($T_a$) or the temperature measured by the internal thermistor in the power module ($T_{th}$). Therefore, the simulation model has been used to generate the complete thermal impedance matrix using both of these reference temperatures and the absolute temperature of the devices can be calculated using either:

$$[T]=\lfloor Z_{th,j-a}\rfloor \cdot [P]+T_a \qquad (2.6)$$

or $$[T]=\lfloor Z_{th,j-th}\rfloor \cdot [P]+T_{th} \qquad (2.7)$$

To identify the hottest device in the inverter under any operating condition and to allow the frequency model to be compared against the instantaneous response, Equations 2.6 and 2.7 have been implemented in Simulink. In this model, it is assumed that the power loss in a device is sinusoidal and the duty cycle is approximated by the third harmonic modulation scheme. These are the initial assumptions used to develop the frequency model. Therefore, in order to calculate the temperature of a device the following operating parameters are first defined:

| | |
|---|---|
| IGBT and diode peak conduction loss (W) | $\hat{P}_{con(IGBT)}$ and $\hat{P}_{con(diode)}$ |
| IGBT and diode peak switching loss (W) | $\hat{P}_{sw(IGBT)}$ and $\hat{P}_{sw(diode)}$ |
| Displacement Power factor | DPF or $\cos(\theta)$ |
| Modulation index | m |
| Output frequency (radians/s or Hz) | $\omega$ or $F_{out}$ |

However, when an inverter is operating at an output frequency of 0 Hz, which is defined as a stationary vector condition, a device can be continuously operating at the output angle ($\omega t$) where its peak power loss occurs (i.e. switching the peak load current). At this frequency there is no filtering effect ($A_{Fn}=1$) due to the thermal time constants. Consequently, for a constant power loss, the resulting steady-state temperature will be higher in a stationary vector condition than at any other frequency. Consequently, a device is more likely to exceed its maximum operating temperature. Therefore, this section is focused on the development of a frequency model that will protect an inverter operating in a stationary vector condition.

2.3.1 Protection of an Inverter Operating in a Stationary Vector Condition

The output of the steady-state frequency model is equivalent to the peak temperature of a device calculated over a complete output cycle of the inverter, i.e. the peak ripple temperature is calculated using the Taylor series approximation. Therefore, in order to protect every device in the inverter under a specific operating condition, the frequency model is used to estimate the temperature of the device in which the highest peak temperature occurs. Using this approach, the temperature estimated by the frequency model will be equal to or higher than the hottest device in the inverter. However, due to the thermal coupling between devices, the peak temperature and the device in which this temperature occurs will depend on the operating conditions. Consequently, more than one frequency model may be required.

Figure 18:
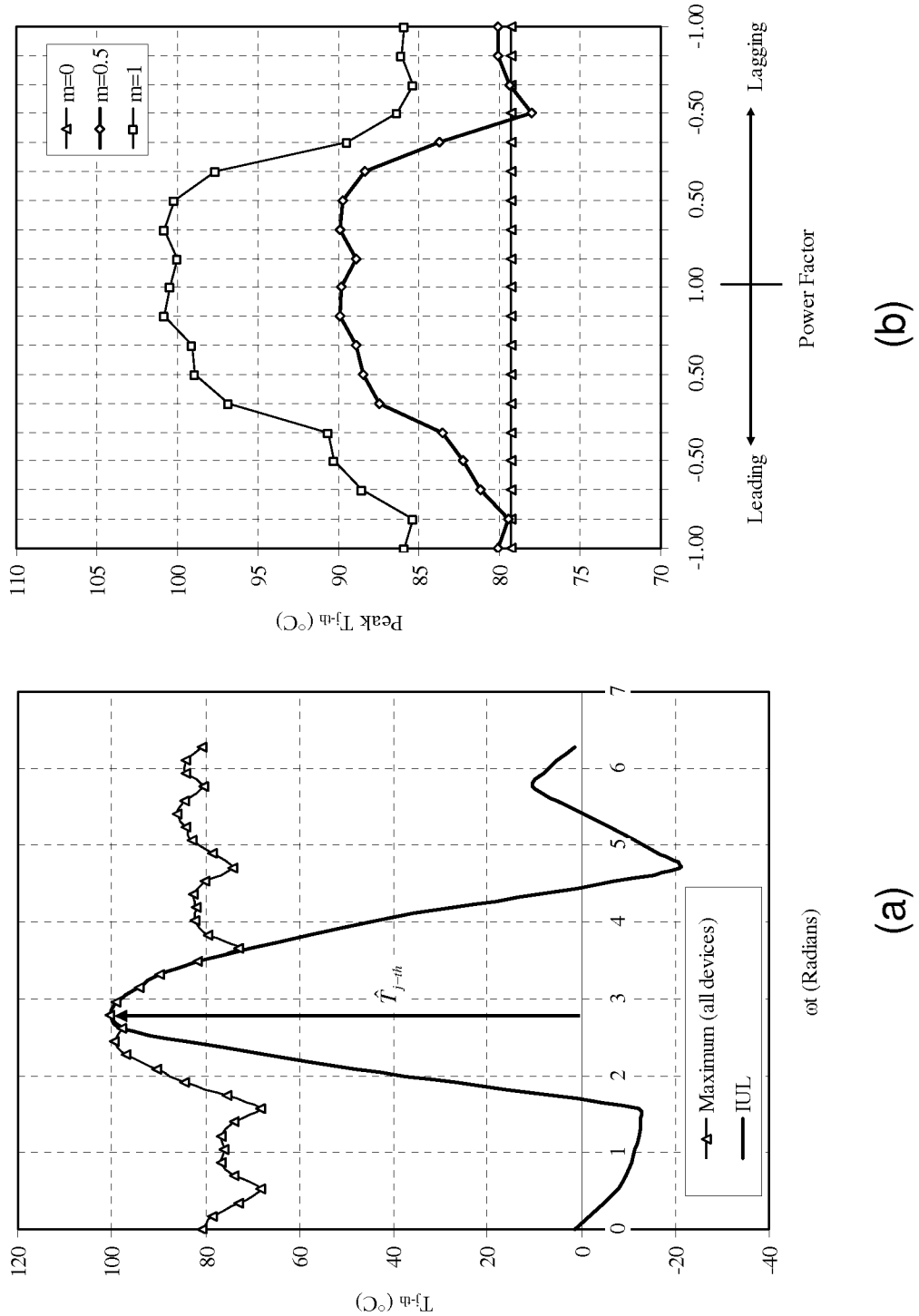
FIG. 18 depicts a maximum steady-state junction-to-thermistor temperature (a) selection of the peak temperature for a unity displacement power factor and modulation index (b) peak temperature calculated for all operating conditions.

In this section, an example is used to describe the procedure for identifying the devices that are to be modelled. In this example, the temperature is calculated using the equivalent Foster networks in the junction-to-thermistor thermal impedance matrix. Therefore, to calculate the instantaneous temperature, Equation 2.7 is implemented in the Simulink model. The peak switching and conduction loss for the IGBTs (68 W) and diodes (34 W) has been selected to ensure that no device can exceed 150° C. when operating at any displacement power factor or modulation index. The first step in the procedure is to calculate the steady-state temperature (junction-to-thermistor) of each device over a complete output cycle ($\omega t = 0$ to $2\pi$). By definition, when operating in a stationary vector condition, the output vector does not rotate and there is no filtering effect due to the thermal time constants. Therefore, the steady-state temperature can be calculated directly using the sum of the thermal resistances in each network. After completing this calculation, the peak temperature that occurs over the output cycle ($\hat{T}_{j-th}$) can then be selected, and this process is illustrated in FIG. 18(a).

Figure 19:
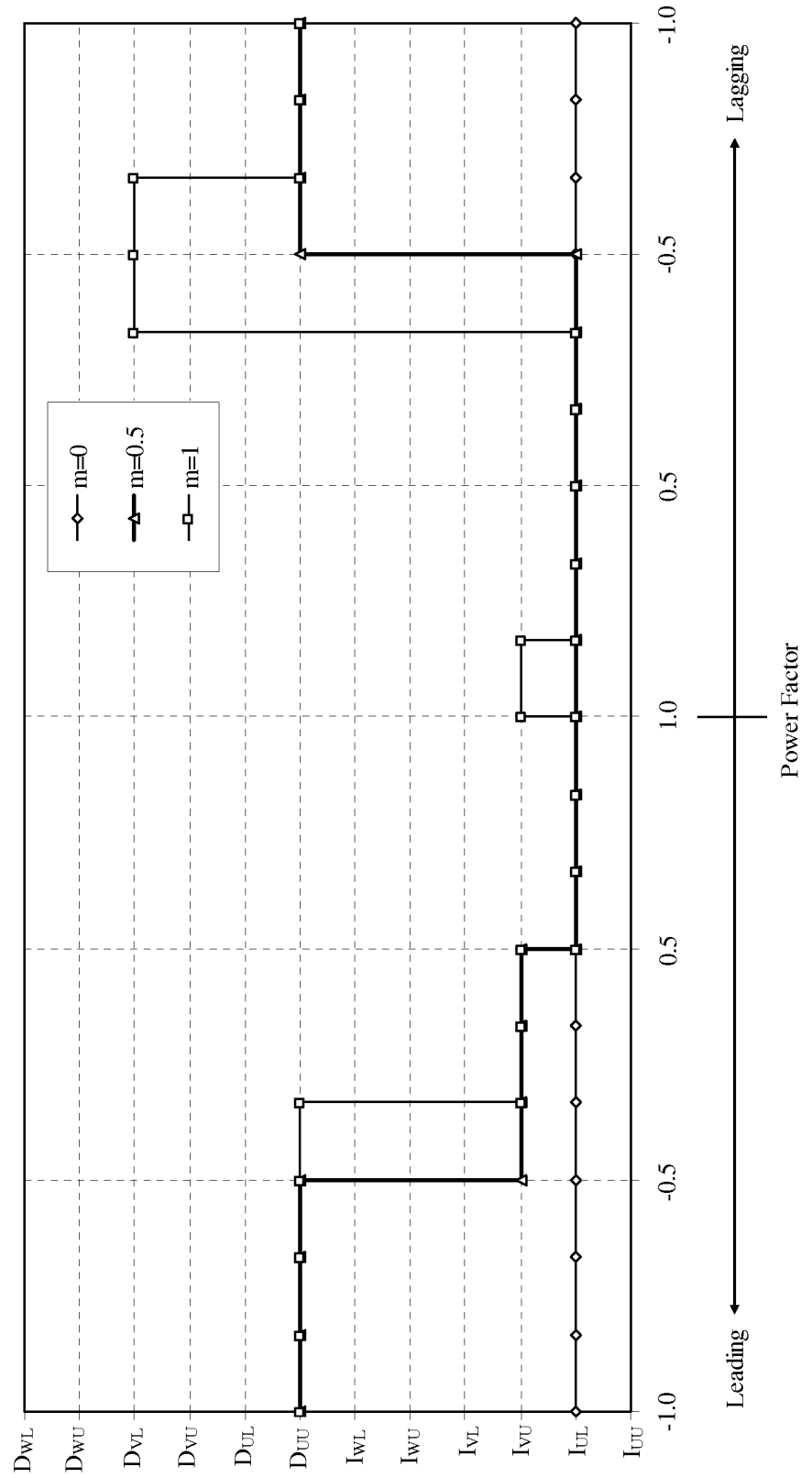
FIG. 19 depicts the devices in which the peak temperature occurs when operating in a stationary vector condition with a constant power loss.

In this figure, the maximum steady-state temperature between each device and the internal thermistor is calculated over a complete output cycle when the inverter is operating with a unity displacement power factor and modulation index. As shown, the peak temperature calculated over the cycle can then be selected. This process is repeated at each displacement power factor and modulation index. The peak steady-state temperature calculated in each of these conditions is shown in FIG. 18(b). The next step is to identify the device in which this peak temperature occurs. For example, in FIG. 18(a) the device selected is the lower IGBT in the U phase ($I_{UL}$). Therefore, when the displacement power factor and modulation index are unity, estimating the temperature of $I_{UL}$ (single frequency model) will ensure that the inverter is protected regardless of the output angle ($\omega t$). However, as discussed, the device in which the peak temperature occurs is dependent on the operating conditions and this can be seen in FIG. 19.

From these results, it can be seen that in order to protect every device in the inverter the frequency model is used to estimate the temperature of four devices; these are $I_{UL}$, $I_{VU}$, $D_{UU}$ and $D_{VL}$. This is because in at least one of the operating conditions examined the peak temperature occurs in one of these devices.

These results show that, when using the frequency model to protect the inverter in a stationary vector condition, it is not necessary to implement the complete thermal impedance matrix. However, in a power module, the thermal coupling between the devices has a considerable impact on the device temperature, and this coupling is dependent on the layout of the power module. Therefore, if the frequency model is developed for a power module where the position of the devices and/or the internal thermistor are different (e.g. a power module produced by a different manufacturer) more or less devices may need to be modelled to ensure the inverter is protected under all possible operating conditions.

The procedure outlined in this section has been used to identify the devices that are to be modelled to protect an inverter operating in a stationary vector condition with a constant power loss. The same procedure can be used to identify the devices that are to be modelled at different output frequencies and with different peak losses. In summary, to select the devices the following steps are to be performed:

1. Calculate the instantaneous temperature over a complete output cycle of the inverter using the self and mutual thermal impedances defined between the junction of a device and the chosen reference point.

2. Repeat this calculation for each device and operating condition. These can include the output frequency, displacement power factor, modulation index and the peak switching and conduction loss for the IGBTs and diodes.

3. Select the maximum temperature that occurs over the output cycle ($\hat{T}_{j-ref}$).

4. Identify the device in which the peak temperature occurs.

As described, for a given power loss a device is more likely to exceed its maximum temperature when operating at low output frequencies. Therefore, in the remainder of this section, the steps outlined above are used to select the devices that are to be used to protect the inverter in a stationary vector condition and the effect of operating at different output frequencies is ignored.

2.3.2 Estimated Temperature Over a Complete Output Cycle of the Inverter

Figure 20:
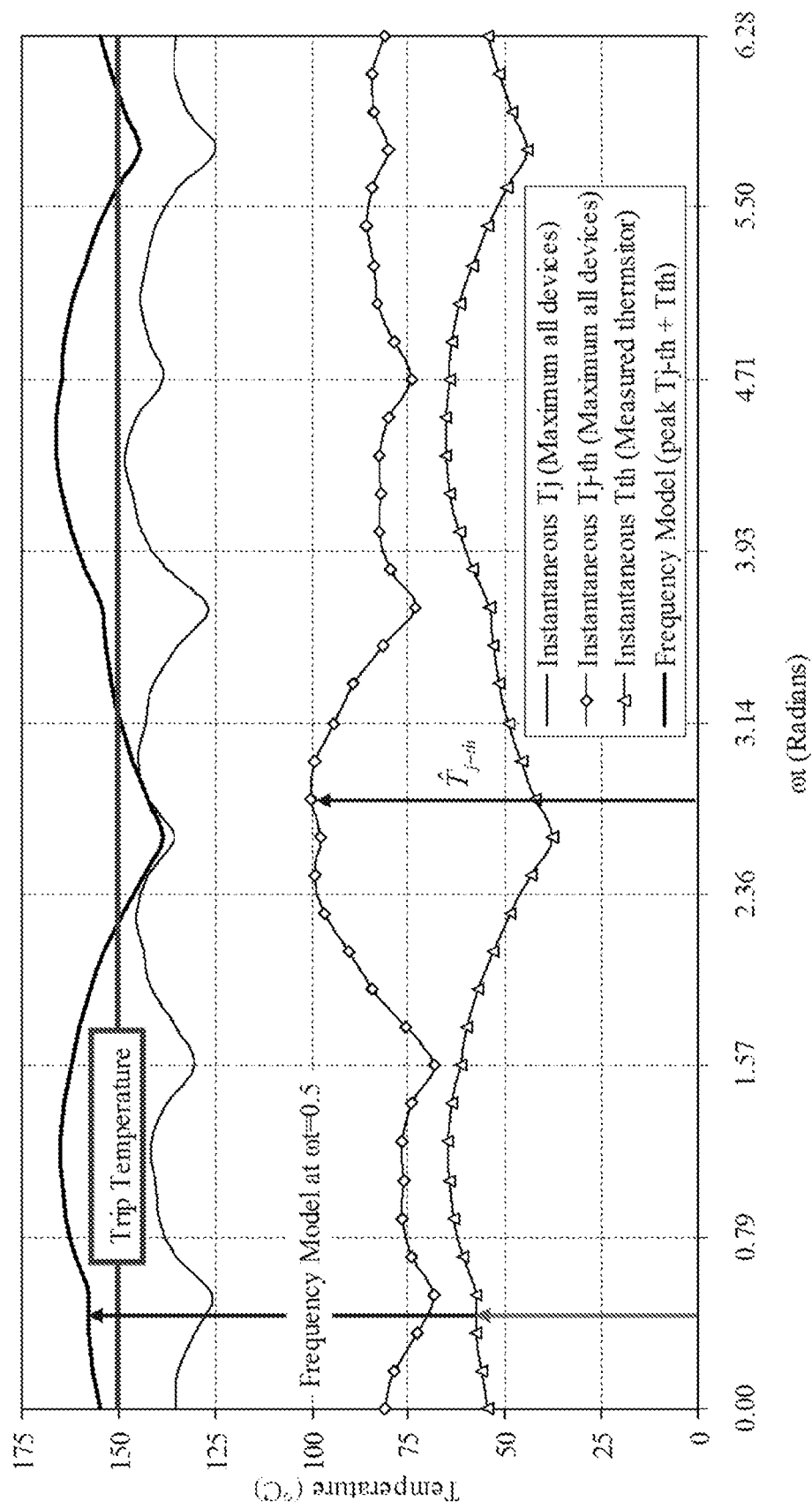
FIG. 20 depicts a comparison of the temperature estimated by the frequency model and the maximum steady-state temperature when operating in a stationary vector condition.

In an inverter, the reference temperature is usually measured by a thermistor. Many manufacturers now include a thermistor within a standard power module. Therefore, the reference temperature used in the thermal model is an instantaneous value. Combining this with the output of the steady-state frequency model (constant value) will have a significant impact on the accuracy of the estimated temperature at low output frequencies. To show this effect, the temperature estimated using the frequency model is compared against the temperature of the hottest device in the inverter. A comparison for an inverter operating in a stationary vector condition is shown in FIG. 20.

For these operating conditions, the peak temperature occurs at an output angle of 2.79 rads. At this angle, the temperature estimated by the frequency model is identical to the maximum instantaneous temperature. However, over an output cycle the temperature measured by the thermistor changes due to the thermal coupling between the thermistor and the devices in the inverter (IGBTs and diodes). Therefore, since the output of the frequency model is equivalent to the peak junction-to-thermistor temperature, when the inverter is operating at any other output angle, the temperature estimated by the frequency model will be higher than the hottest device. If this exceeds the maximum operating temperature, the drive will enter an error or trip condition, which will prevent any further increase in temperature. In this condition the performance will be restricted by the thermal model rather than the true operating temperature of the devices and this will have a direct impact on the rating of the inverter. For example, the results in FIG. 20 show that the temperature of the hottest device is always below 150° C. To ensure that the temperature estimated by the thermal model does not exceed the maximum temperature, the peak power loss in the IGBTs is reduced from 68 W to 62.5 W. This decrease in power loss corresponds to a reduction in the maximum output current available from the inverter, which is an undesirable effect.

However, as the output frequency is increased the ripple present in the measured thermistor temperature will be reduced and eventually this will become a constant value, which is independent of the output angle. From tests carried out on a typical power module (C. Yun, P. Malberti, M. Ciappa, and W. Fichtner, "Thermal component model for electrothermal analysis of IGBT module systems," *IEEE Transactions on advanced packaging*, vol. 24, pp. 401-406, August 2001), it was found that the measured ripple temperature was negligible if the output frequency was above 5 Hz. Therefore, using the frequency model to protect the inverter will only have a significant effect on the maximum output current available from the inverter at low output frequencies.

2.4 Simplifying the Frequency Model

In the previous section, it was shown that, when using the frequency model to protect the inverter, it is not necessary to calculate the temperature of every device. Therefore, compared to the implementation of the complete thermal impedance matrix the number of calculations that are performed by the thermal model is significantly reduced. Even so, to implement the thermal model using the available resources, further assumptions are to be made in order to reduce the number of network elements (i.e. thermal impedances) used in the model.

To show the effect of any assumptions, the temperature estimated by the frequency model is compared with the maximum instantaneous temperature calculated using the Simulink model, which includes all of the mutual coupling in the power module. In the Simulink model it is assumed that the power loss for each device is a rectified sinusoid and the duty cycle is approximated using the third harmonic scheme. Thus, if the instantaneous temperature is compared directly with the output of the frequency model the differences between the calculated temperatures will be due to one or both of the following:

a) The assumptions used to develop the frequency components for the switching and conduction loss models, i.e. the number of harmonic components used in the approximation of the power loss and duty cycle.

b) The elements in the thermal impedance matrix that are not included in the model.

The impact of the assumptions used to develop the frequency components for the models were reviewed in section 1. Therefore, in order to isolate the effect of the simplifications made to the thermal impedance matrix, the temperature estimated by the steady-state frequency model is approximated by:

$$T_{ss(n=\infty)} = \hat{T}_{j\text{-}ref(n=\infty)} + T_{ref} \quad (2.8)$$

The temperature calculated using this equation is equal to the output of the frequency model if all of the harmonics ($n=\infty$) were included. This is the same as the temperature calculated using the Simulink model. Therefore, any differences in the comparisons will be due to the selection of the device being modelled and/or any of the mutual impedances that have been ignored. In the following comparisons, the frequency model is developed using the thermal impedance measured between the junction of a device and the internal thermistor in the power module, while the operating conditions are the same as those defined in Section 2.3.1.

2.4.1 Single Device Model

In this section, the temperature of a device is calculated using the self thermal impedance and any coupling that exists between the devices in the inverter is ignored. Therefore, the terms in the frequency model are calculated for the elements in a single equivalent Foster network. To implement this model the self impedance for a device is selected from the complete thermal impedance matrix.

When an inverter is operating with a positive displacement power factor, the power loss in an IGBT will normally be much higher than a parallel diode. Consequently, in this condition, the largest temperature difference measured between the junction of a device and the internal thermistor will occur in one of the IGBTs. However, the opposite applies when the displacement power factor is negative. In this condition, it is likely that the peak temperature will occur in one of the diodes. Therefore, because the effect of the operating conditions on an IGBT and diode are different, estimating the temperature of a single device will inevitably lead to a significant underestimation of the temperature in some operating conditions. To show this effect, the frequency model is used to estimate the temperature of the lower IGBT in the U phase ($I_{UL}$) of the inverter. This device is selected from the results shown in FIG. 19, where it is evident that the peak temperature occurs more often in this IGBT.

Figure 21:
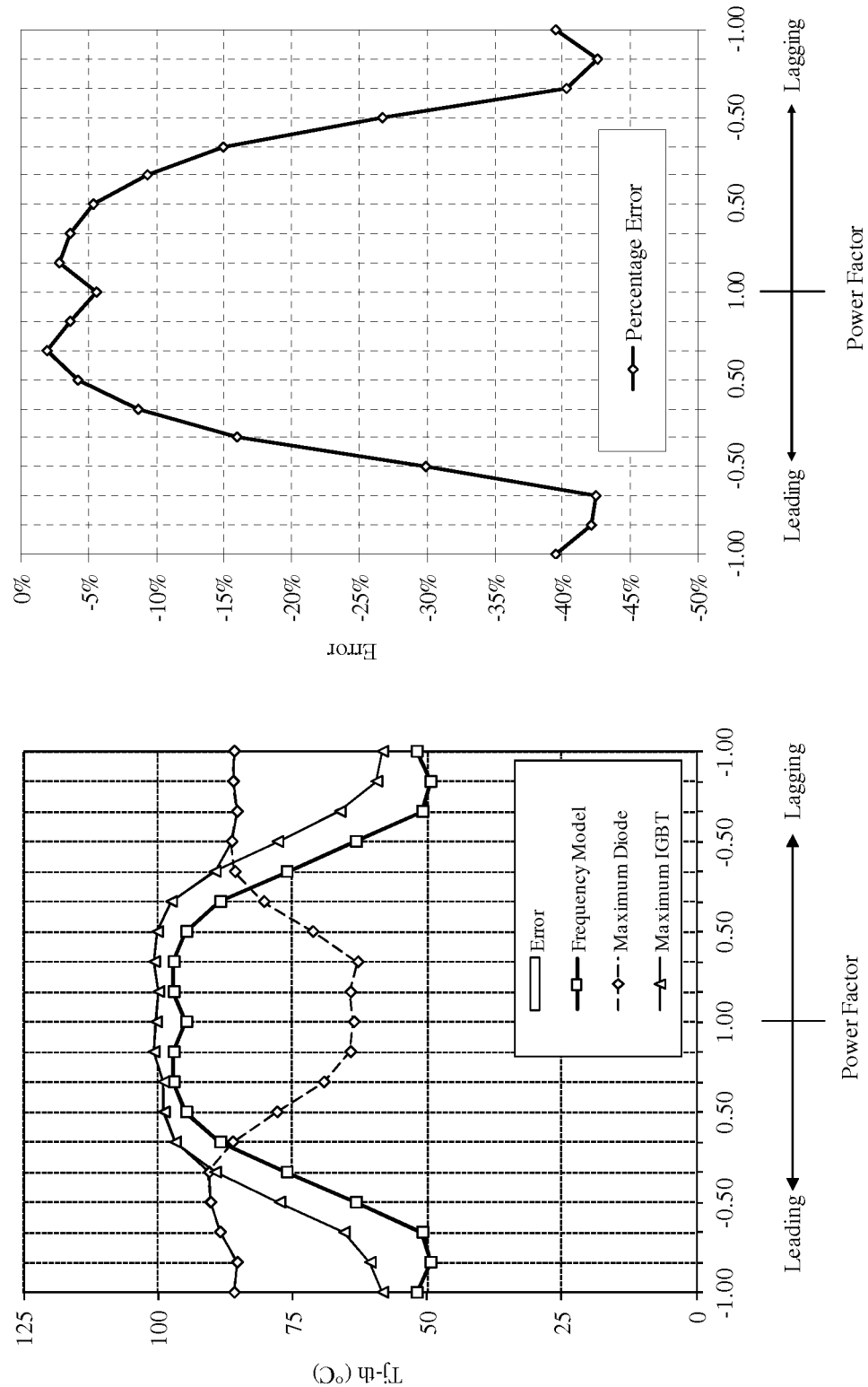
FIG. 21 depicts a comparison of the single device model developed for $I_{UL}$, when operating with a unity modulation index (a) junction-to-thermistor temperature (b) percentage error.

In FIG. 21(a), the temperature estimated using the self thermal impedance (simplified frequency model) is compared with the maximum IGBT and diode temperature calculated using the complete thermal impedance matrix.

Figure 22:
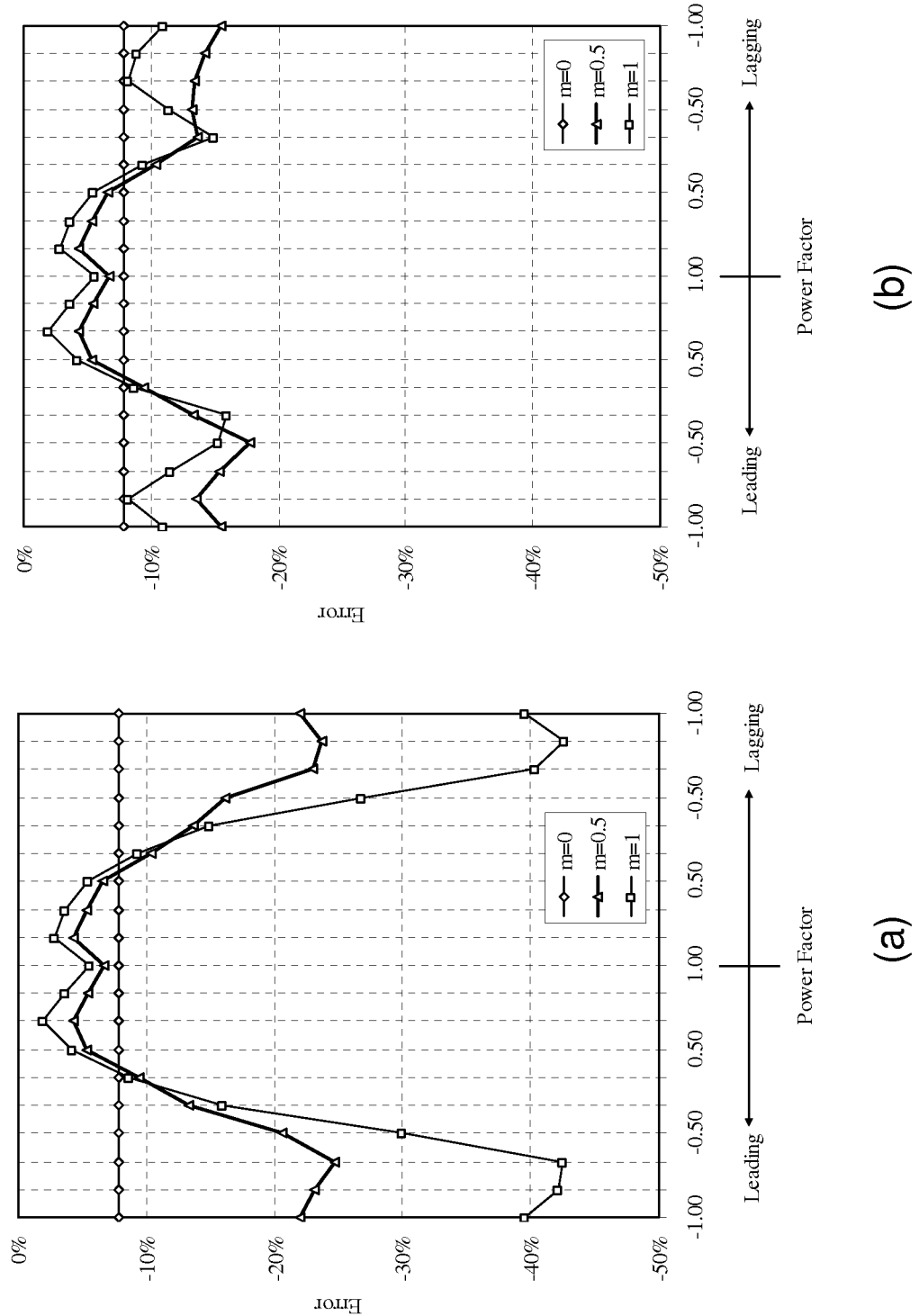
FIG. 22 depicts an error in the single device model when operating in a stationary vector condition (a) IGBT model (b) IGBT and diode models implemented in parallel.

In this figure, it is evident that in most operating conditions the temperature estimated by the frequency model is considerably lower than the maximum device temperature. As expected, the error is larger when the peak temperature occurs in one of the diodes. In FIG. 21(b), the error is represented as a percentage of the maximum device temperature and since this is underestimated by the frequency model, the error is negative. The percentage error is an important indication of the error that could be expected when operating with a unity modulation index. However, the modulation index will have a significant effect on the accuracy of the simplified frequency model. Consequently, the error is to be calculated over the full range of the modulation index (m=0 to 1). These results are shown in FIG. 22(a).

These results show that when using a single IGBT model with no coupling, the temperature is significantly underestimated in most operating conditions. Therefore, at minimum, the frequency model is used to estimate the temperature of one IGBT and one diode in the inverter. Furthermore, if these models are implemented in parallel, the devices in the inverter are protected by the model that estimates the highest temperature and this can improve the level of protection. As with the IGBT model, the diode is selected using the results in FIG. 19 and the device used in the model is the upper diode ($D_{UU}$) in the U phase of the inverter. The error calculated using the highest temperature estimated by the IGBT and diode model is shown in FIG. 22(b). By using two models the maximum error has been considerably reduced, although it is still significant in many operating conditions. Consequently, this model is not suitable to protect an inverter operating at low output frequencies, and an alternative model is to be used. Furthermore, the results presented in this section highlight the limitation of a model developed using the thermal impedances provided in the datasheet of a device. These are normally limited to the self thermal impedance for an IGBT and diode measured between the junction of the device and the case of the power model ("Application Note AN2008-03: Thermal Equivalent Circuit Models" Infineon 2008, incorporated herein by reference).

2.4.2 Single Device Model Including the Thermal Coupling Between Devices

Figure 23:
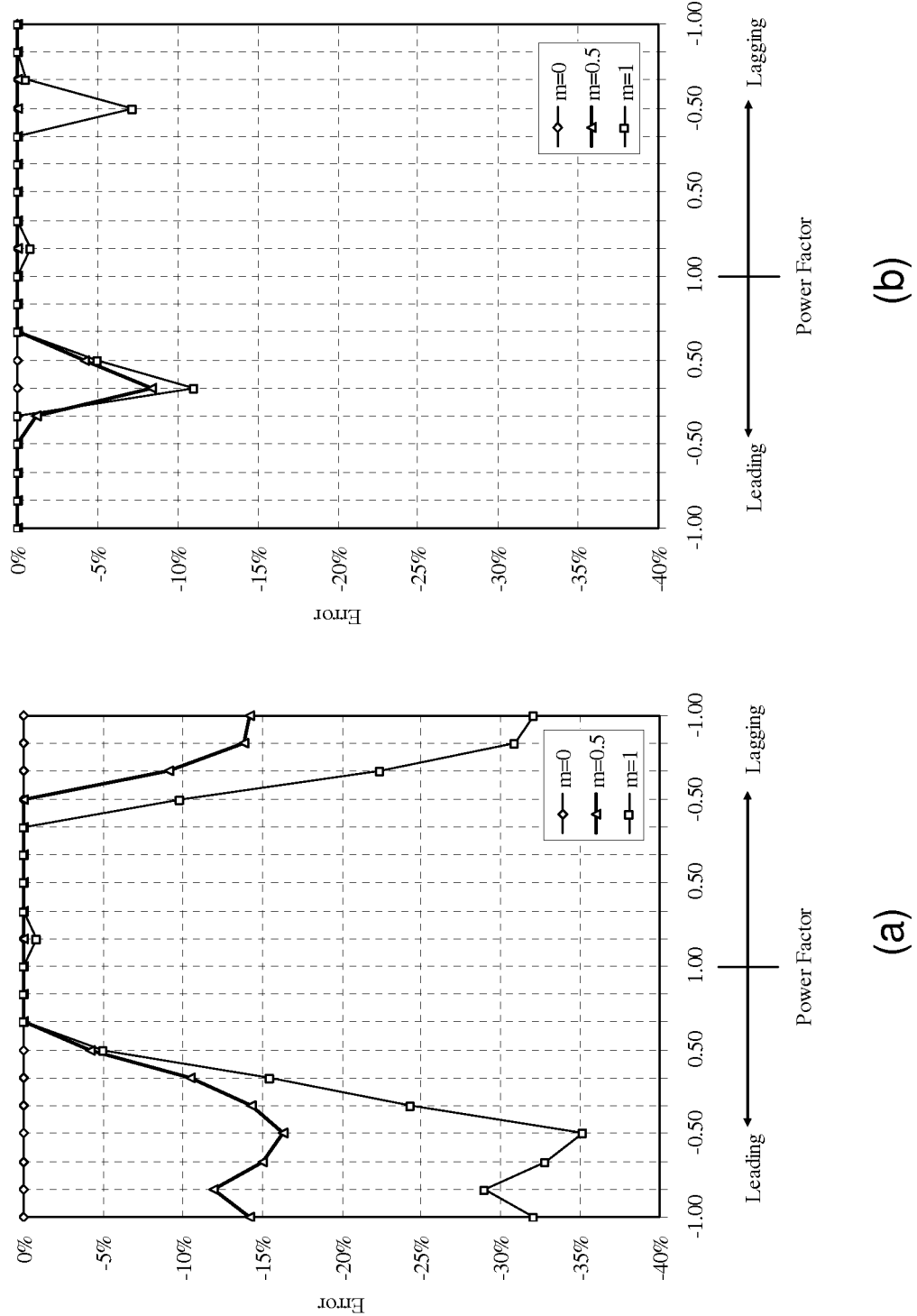
FIG. 23 depicts an error in the single device model with thermal coupling when in a stationary vector condition (a) IGBT model (b) IGBT and diode models implemented in parallel.

In order to reduce the error in the estimated temperature and develop a model that can be used to provide sufficient protection for the inverter, the thermal coupling from the neighbouring devices is to be included. In this section, the temperature of $I_{UL}$ and $D_{UU}$ are calculated using the self and all of the mutual thermal impedances associated with these devices. Therefore, in this model, the temperature will only be underestimated if the peak temperature does not occur in either of these devices. As previously, FIG. 23(a) shows the error that would be expected if only the IGBT model ($I_{UL}$) were used to protect every device in the inverter, whereas FIG. 23(b) shows the error if the IGBT and diode models are implemented in parallel. This allows a direct comparison to be made with the results in FIG. 22, which shows the error calculated when only the self thermal impedance is used.

As shown in FIG. 23(a), when using the IGBT model there is no error in the operating conditions where the peak temperature occurs in this device. However, the error is still significant when the inverter is operating with a negative displacement power factor. Therefore, both models are to be implemented in parallel. The resulting error is shown in FIG. 23(b). It can be seen that the maximum error is reduced to 11%. As described, where an error occurs, the peak temperature does not occur in either $I_{UL}$ or $D_{UU}$.

Although incorporating the mutual thermal coupling into the model has been shown to reduce the error, any error in the thermal model is undesirable, especially if it could result in a device exceeding its maximum temperature. However, the error has been calculated using a single IGBT and diode model with the inverter operating in a stationary vector condition, and when assessing the impact of this error the following factors should be considered:

If there are sufficient computational resources, more devices can be modelled to prevent any underestimation of the temperature (as described in section 2.3.1).

The operating conditions where the error is significant are not common in an inverter driving a motor load, i.e. low frequency and a high modulation index.

The error will be different for each power module and will be considerably lower for a power module where the thermal coupling between devices is less significant.

2.5 Thermal Parameters Used in the Frequency Model

In the simplified model described in section 2.4.2, the temperature of one IGBT and one diode is estimated using the self and all of the mutual thermal impedances associated with these devices. To implement this model, these thermal impedances are represented by an equivalent Foster network with one or more elements. The following parameters are defined:

Thermal resistance ($R_{th}$)—This defines the magnitude of the frequency terms in a stationary vector condition.

Time constant ($\tau_{th}$)—This defines the change in magnitude with the output frequency of the inverter.

Offset angle ($\alpha$)—This is the phase shift used to represent the power loss in each device in the inverter with reference to the modelled device. This determines the magnitude of the corresponding sine and cosine components for each harmonic.

The number of network elements that are used to represent the self and mutual thermal impedances are selected in the next section.

2.5.1 Selection of the Elements in Each Foster Network

The number of elements used in the frequency model will have a direct impact on the number of calculations required to estimate the device temperature, but will also have an effect on the following:

a) The magnitude of the steady-state frequency components b) The transient response.

If possible, an equivalent network should have enough elements to ensure that the response of the network is an accurate representation of the measured impedance. In general, to achieve this no more than four elements are required (V. Blasko, R. Lukaszewski, and R. Sladky, "On line thermal model and thermal management strategy of a three phase voltage source inverter," in *Industry Applications Conference, 1999. Thirty-Fourth IAS Annual Meeting. Conference Record of the 1999 IEEE*, 1999, pp. 1423-1431 vol. 2; and U. Drofenik, D. Cottet, A. Musing, J.-M. Meyer, and J. W. Kolar, "Computationally Efficient Integration of Complex Thermal Multi-Chip Power Module Models into Circuit Simulators," in *Power Conversion Conference—Nagoya, 2007. PCC '07*, 2007, pp. 550-557, both of which are incorporated by reference herein). However, in this model, the number of elements that can be used is restricted by the available computational resource and at present, implementing a model with four elements in each network is not possible.

In any power module, the temperature of an active device will be dominated by its self thermal impedance. By definition, this includes the impedance measured between the junction of the device and the case of the power module, e.g. the silicon chip, solder, case, etc. Therefore, there will be multiple time constants associated with this impendence and as a result, more elements will be used in these networks. With these limitations in mind, the following elements have been chosen:

Self thermal impedance—Two network elements

Mutual thermal impedance—Single network element

As discussed, the number of elements is constrained by the computational resource and if possible, more elements should be used to improve the transient response. In summary, to estimate the temperature of one device, each term in the switching and conduction loss models is calculated for thirteen elements (two self and eleven mutual elements).

2.5.2 Reducing the Number of Mutual Terms in the Frequency Model

Figure 24:
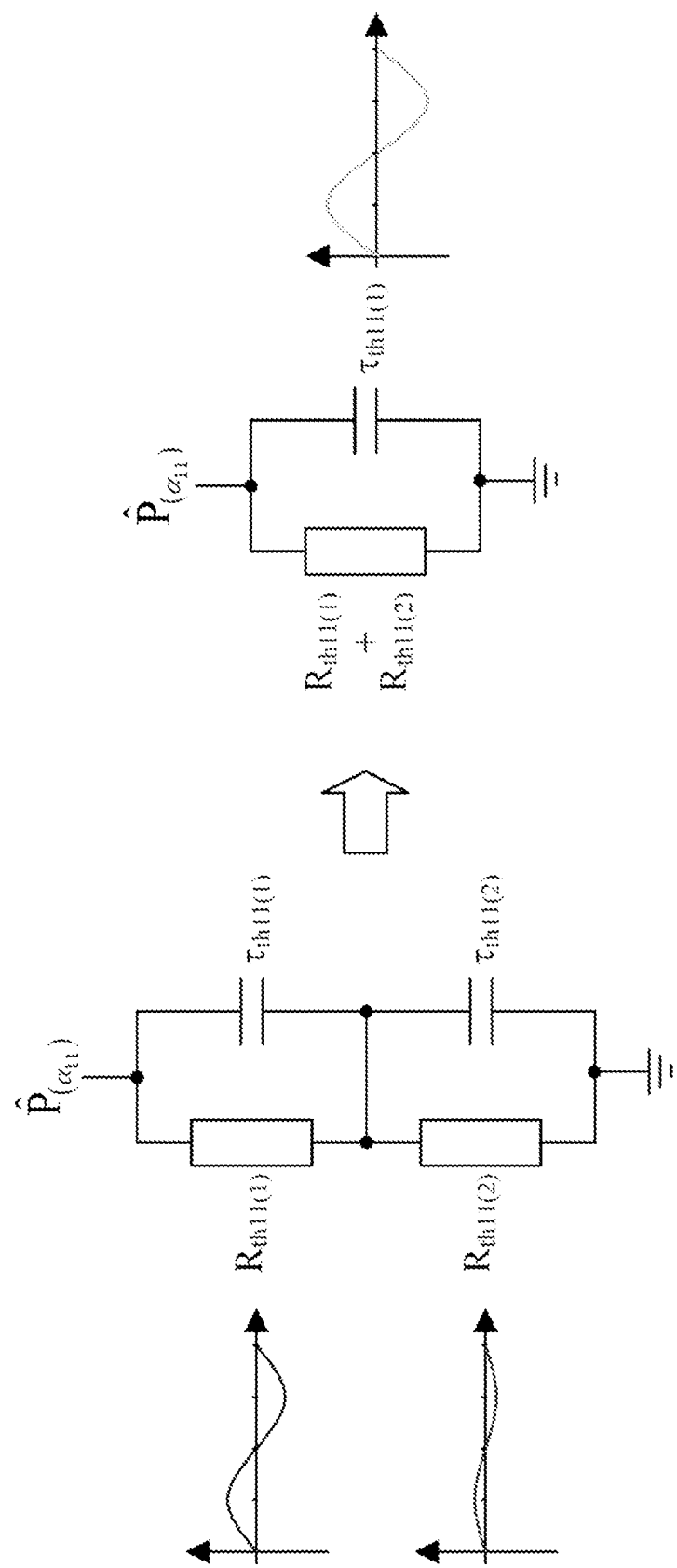
FIG. 24 depicts combining network elements with the same time constant and offset angle.

If the time constant of two or more of the elements that are used to represent the mutual thermal impedance are the same, the magnitude of the terms in the frequency model will change at the same rate, i.e. they will have the same phase shift ($\beta$) and filter magnitude ($A_{F_n}$). If these elements are in the same network (same offset angle), the combined response can be represented by a single element by simply adding the thermal resistances together. This process is equivalent to adding two frequency components that are in phase, but with different magnitudes. This is illustrated in FIG. 24.

With this approach, instead of calculating the frequency terms for each element separately, the magnitude can be calculated once by using the combined network parameters. This is similar to the method that was described in section 2.2, although the calculations in this section can be performed off-line. The method illustrated in FIG. 24 can also be used to combine network elements in different networks (different offset angles). This is equivalent to adding two or more frequency components that are not in phase. As a result, a different thermal resistance and offset angle is used for each harmonic (n) in the frequency model. Even so, each term is still to be calculated only once. The magnitude of the combined thermal resistance for the $n^{th}$ harmonic is given by:

$$R_{th,n} = \sqrt{\left[\sum_{j=1}^{m} R_{th,ij(k)} \cos(n\alpha)\right]^2 + \left[\sum_{j=1}^{m} R_{th,ij(k)} \sin(n\alpha)\right]^2} \quad (2.9)$$

and the corresponding offset angle is calculated using:

$$n\alpha_n = \cos^{-1}\left(\frac{\sum_{j=1}^{m} R_{th,ij(k)} \cos(n\alpha)}{|R_{th,n}|}\right) \quad (2.10)$$

where $R_{th,n}$ and $\alpha_n$ are the magnitude and phase shift for the $n^{th}$ harmonic, m is the number of network elements with the same time constant and k is the position of the element in each network.

Due to the implementation of the duty cycle, the terms in the frequency model for an IGBT and diode are calculated differently. Consequently, the network elements representing the coupling due to the loss in an IGBT and diode cannot be combined. Nevertheless, if the mutual thermal impedances from the IGBTs and diodes could be represented by a common time constant, all of the coupling in an inverter could be modelled by just two network elements, with one representing the coupling from the IGBTs and the other from the diodes. Using this approximation, the steady-state temperature in a stationary vector condition will remain the same but the transient response will change. The effect this has on the accuracy of the estimated temperature will depend largely on the thermal properties of the inverter, specifically the ratio between the self and mutual thermal impedances. Furthermore, the method used to select the common time constants for the combined network elements will have a significant effect and this is described in the next section.

2.5.2.1 Calculation of the Common Time Constants for the Combined IGBT and Diode Networks In order to combine the equivalent networks for the mutual thermal impedances, a common time constant is selected for the network elements used to represent the coupling from the IGBTs ($\tau_{th,IGBT}$) and diodes ($\tau_{th,diode}$) in the inverter. In order to select these time constants, a Simulink model is used to calculate the instantaneous temperature response of the modelled devices ($I_{UL}$ and $D_{UU}$) during a step change in the peak power loss. This calculation is repeated using the original network parameters determined from the Flotherm model and the common time constants, which are selected to minimise any differences between the responses.

Figure 25:
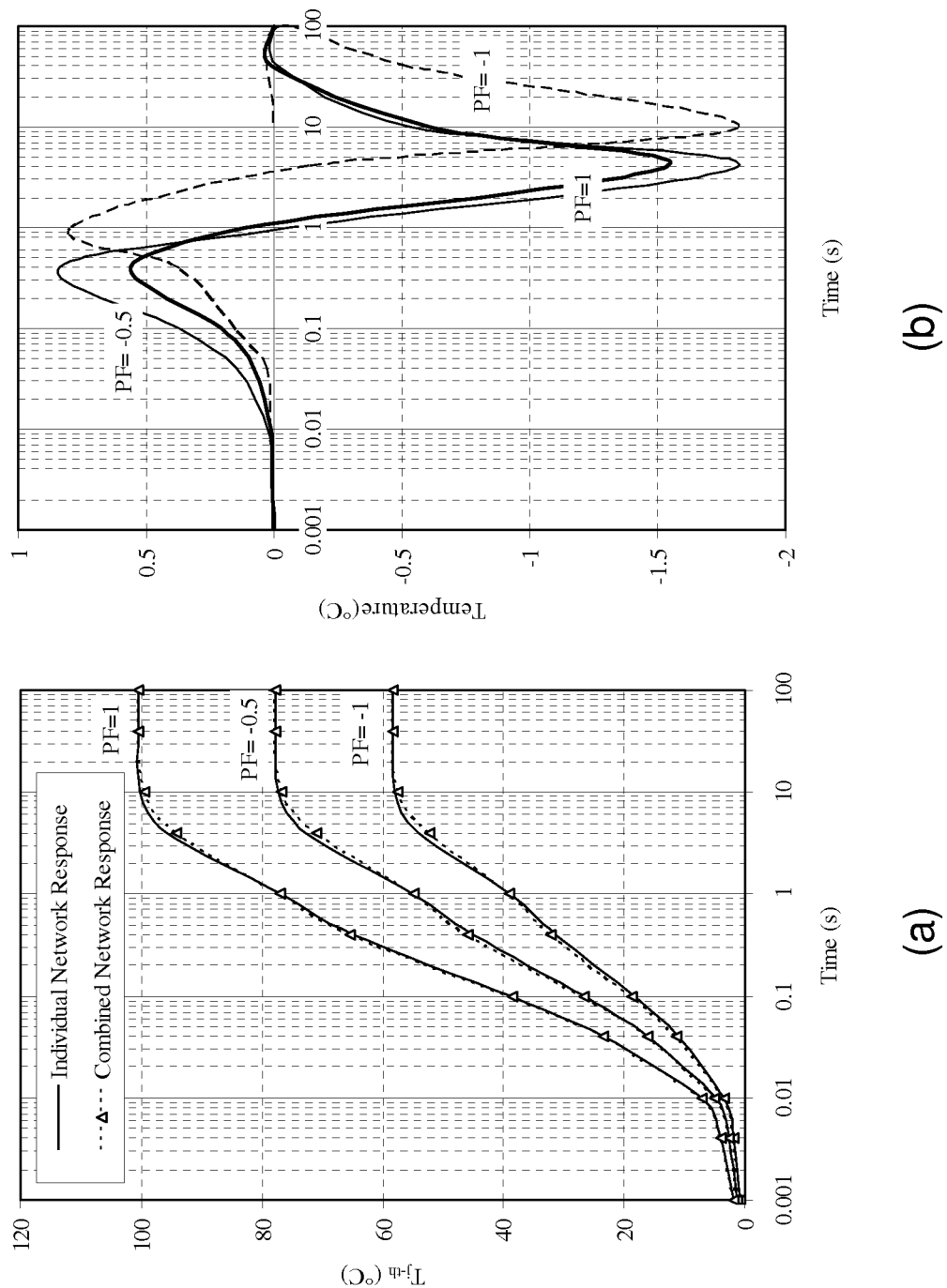
FIG. 25 depicts a comparison of the step response calculated using the original network parameters and the common time constants when operating in a stationary vector condition with a unity modulation index (a) step response (b) temperature difference.

An example of the step response calculated for the IGBT model operating in a stationary vector condition is shown in FIG. 25(a). The time constants used in this comparison are:

$\tau_{th,IGBT}$=3.5 s $\tau_{th,diode}$=3 s

The difference between the responses is shown in FIG. 25(b). For the chosen operating conditions, which are the same as those defined in section 2.3.1, the temperature is never underestimated (negative value) by more than 2° C. This approximation will also have an effect on the steady-state temperature calculated at higher output frequencies. However, because the time constants associated with the mutual coupling are relatively long, as the output frequency is increased the effect that these terms have on the device temperature is reduced quicker than the self impedance.

The procedure used to calculate the thermal parameters is summarised below and all of these calculations can be completed off-line:

1. Calculate the thermal resistance, time constant and offset angle for the two network elements used to represent the self impedance for the chosen device.

2. Calculate the thermal resistance, time constant and offset angle for the eleven mutual impedances for the chosen device.

3. Use Equations 2.9 and 2.10 to calculate the thermal resistance and offset angle for the combined networks representing the coupling from the IGBTs and diodes in the inverter, and repeat this for each harmonic (n=1 to 3).

4. Select the common time constant for the combined IGBT ($\tau_{th,IGBT}$) and diode ($\tau_{th,diode}$) networks.

Using this procedure, the parameters for four Foster network elements are calculated. These represent the self and all of the mutual thermal impedances associated with one of the modelled devices. Therefore, the terms in the frequency model only need to be calculated eight times, once for each peak loss (switching and conduction) applied to each network element (two self and two mutual elements).

2.6 Implementation of the Frequency Model and Summary of the Input Parameters

To implement the frequency model the following temperatures are calculated:

Steady-State ($T_{ripple}$)—The peak ripple temperature is calculated from the ripple equation using the Taylor series approximation and this component is applied in the model as a constant value.

DC ($T_{DC}$)—The magnitude of the DC terms for each network element in the model are calculated separately. These magnitudes are applied to an individual transfer function of a first order filter with a unity magnitude (1K/W) and the time constant of the associated network element.

Transient ($T_{exp}$)—This magnitude is calculated from the change in the peak ripple temperature and this is applied to a high pass filter. The time constant ($\tau_{exp}$) used in this filter is selected from one of the four network elements.

The control diagram for the frequency model is shown in FIG. 2. This diagram shows how the thermal model is implemented in the drive. It includes all of the input parameters that are used to calculate the peak loss in an IGBT or diode, and the resulting steady-state, DC and transient components of the temperature response.

Variants

It will be understood that the above description of specific embodiments is by way of example only and it is not intended to limit the scope of the present disclosure. Many modifications of the described embodiments, some of which are now described, are envisaged and intended to be within the scope of the present disclosure.

In the embodiments described above, insulated gate bipolar transistors (IGBT) are used. In some embodiments another kind of transistor or other switching device is used as well or instead.

Although the model described above uses four thermal impedances, in some embodiments, another quantity of thermal impedances is used, such as one, two or three, or a quantity less than 10, 20 or 50.

Although the model described above is for the temperature calculation of one device on the inverter module, in some embodiments, it may be anticipated that the hottest device will be one of two or more devices, depending on conditions. In that case, calculations can be made for all relevant devices and the appropriate device calculations can be used based on the conditions at a given time.

Although thermal impedance phase in the model described above outputs $T_{Ripple}$ that is calculated using only the first and second harmonic terms for the switching power loss, and only the first, second and third harmonic terms for the conduction power loss, in some embodiments, higher harmonic terms are also used or a different combination of harmonic terms is used. An increase in the number of harmonic terms used causes an increase in required processor power but improved accuracy of the model. In other embodiments, fewer harmonic terms are used.

Although the use described above is for an inverter module of a drive, in some embodiments, other applications are envisaged, such as for other inverter modules not in a drive, for other general modules comprising semiconductor devices, or for any device having a cyclic power loss such that the power loss can be represented by a series of harmonics.

The drive can be used to control various types of motor in various applications, including, but not limited to, elevators, conveyor belts, cranes, fans and pumps.

The invention claimed is:

1. A method for controlling the temperature of a first semiconductor device on an inverter module of a drive configured to drive an electrical machine, the method comprising:
    calculating at least one power loss of at least the first semiconductor device;
    calculating at least one harmonic component based on the calculated power loss of at least the first semiconductor device;
    using the at least one harmonic component based on the calculated power loss of at least the first semiconductor device to calculate a temperature of the first semiconductor device; and
    if the calculated temperature of the first semiconductor device does not meet a predetermined temperature condition, issuing a command to control the operation of the drive such that the temperature of the first semiconductor device is changed to meet the predetermined temperature condition.

2. A method as claimed in claim 1, wherein the at least one harmonic component is calculated over a complete output cycle of the inverter.

3. A method as claimed in claim 1, wherein the at least one harmonic component comprises at least two harmonic components.

4. A method as claimed in claim 1, wherein the at least one power loss of at least the first semiconductor device comprises a switching power loss of at least the first semiconductor device.

5. A method as claimed in claim 1, wherein the at least one power loss of at least the first semiconductor device comprises a conduction power loss of at least the first semiconductor device.

6. A method as claimed in claim 1, wherein the at least one power loss of at least the first semiconductor device comprises at least two power losses of at least the first semiconductor device.

7. A method as claimed in claim 1, wherein at least the first semiconductor device comprises at least one other semiconductor device on the inverter module.

8. A method as claimed in claim 1, wherein the temperature is a junction temperature of the first semiconductor device.

9. A method as claimed in claim 1, wherein the temperature is a peak temperature of the first semiconductor device over a complete output cycle of the inverter.

10. A method as claimed in claim 1, further comprising determining at least one thermal impedance associated with the first semiconductor device, wherein using includes using the at least one harmonic component based on the calculated power loss and the at least one thermal impedance associated with the first semiconductor device to calculate the temperature of the first semiconductor device.

11. A method as claimed in claim 10, wherein the at least one thermal impedance comprises a self thermal impedance of the first semiconductor device.

12. A method as claimed in claim 10, wherein the at least one thermal impedance comprises a mutual thermal impedance of the first semiconductor device caused by at least one other semiconductor device on the inverter module.

13. A method as claimed in claim 10, wherein the calculation of the temperature of the first semiconductor device comprises calculating a peak temperature of the first semiconductor device.

14. A method as claimed in claim 1, wherein the first semiconductor device is a transistor.

15. A method as claimed in claim 1, wherein the first semiconductor device is a diode.

16. A method as claimed in claim 1, wherein the inverter module comprises a temperature-sensitive device for providing a reference temperature for use in the calculation of the temperature of the first semiconductor device.

17. A method as claimed in claim 1, wherein the predetermined temperature condition corresponds to a range of temperatures.

18. A method as claimed in claim 17, wherein the range of temperatures comprises a predetermined safe operating range of temperatures for the first semiconductor device.

19. A method as claimed in claim 1, wherein the predetermined temperature condition is not met when the calculated temperature of the first semiconductor device exceeds a predetermined threshold value, and the condition is met when the calculated temperature of the first semiconductor device is below the threshold value.

20. A method as claimed in claim 1, wherein the electrical machine is a motor.

21. A method as claimed in claim 1, wherein the temperature includes a transient temperature.

22. A method for controlling the temperature of a subset of a plurality of semiconductor devices on an inverter module of a drive configured to drive an electrical machine, the method comprising:
applying the method of claim 1 to each semiconductor device of the subset to control the temperature of each semiconductor device of the subset, each semiconductor device of the subset respectively corresponding to the first semiconductor device of claim 1.

23. A method as claimed in claim 22, wherein the subset comprises only two semiconductor devices and the plurality of semiconductor devices comprises additional semiconductor devices.

24. A method for controlling the temperature of a selected semiconductor device of a plurality of semiconductor devices on an inverter module of a drive configured to drive an electrical machine, the method comprising:
assessing present conditions of the inverter module;
based on the assessment, selecting the semiconductor device of the plurality of semiconductor devices that has been predetermined to have the highest expected temperature in conditions corresponding to the present conditions; and
applying the method of claim 1 to control the temperature of the selected semiconductor device, the selected semiconductor device corresponding to the first semiconductor device of claim 1.

25. A method as claimed in claim 24, the method comprising, after a predetermined period of time, repeating the steps of claim 24 resulting in the temperature of a different semiconductor device subsequently being controlled instead of the originally selected semiconductor device.

26. A drive configured to control the temperature of a first semiconductor device on an inverter module of the drive, the drive being configured to drive an electrical machine, the drive being configured to:
calculate at least one power loss of at least the first semiconductor device;
calculate at least one harmonic component based on the calculated power loss of at least the first semiconductor device;
use the at least one harmonic component based on the calculated power loss of at least the first semiconductor device to calculate a temperature of the first semiconductor device; and
if the calculated temperature of the first semiconductor device does not meet a predetermined temperature condition, issue a command to control the operation of the drive such that the temperature of the first semiconductor device is changed to meet the predetermined temperature condition.

27. A drive as claimed in claim 26, wherein the temperature includes a transient temperature.

* * * * *